(12) United States Patent
Dorfman

(10) Patent No.: US 7,352,065 B2
(45) Date of Patent: Apr. 1, 2008

(54) SEMICONDUCTOR DEVICES HAVING AMORPHOUS SILICON-CARBON DIELECTRIC AND CONDUCTING LAYERS

(75) Inventor: Benjamin F. Dorfman, San Francisco, CA (US)

(73) Assignee: Nanodynamics, Inc., Buffalo, NY (US)

(*) Notice: Subject to any disclaimer, the term of this patent is extended or adjusted under 35 U.S.C. 154(b) by 0 days.

(21) Appl. No.: 11/223,645

(22) Filed: Sep. 9, 2005

(65) Prior Publication Data
US 2006/0160372 A1    Jul. 20, 2006

Related U.S. Application Data

(60) Provisional application No. 60/608,998, filed on Sep. 9, 2004.

(51) Int. Cl.
H01L 23/48 (2006.01)
H01L 23/52 (2006.01)

(52) U.S. Cl. ............... 257/758; 257/759; 257/E23.077; 257/E21.576

(58) Field of Classification Search ........ 257/758–760, 257/E23.077, E21.575
See application file for complete search history.

(56) References Cited

U.S. PATENT DOCUMENTS

| 5,569,487 A | 10/1996 | DeVre et al. |
| 5,638,251 A | 6/1997 | Goel et al. |
| 5,774,326 A | 6/1998 | McConnelee et al. |
| 5,942,769 A * | 8/1999 | Grill et al. ............ 257/77 |
| 5,973,908 A | 10/1999 | Saia et al. |
| 6,080,470 A * | 6/2000 | Dorfman ............ 428/216 |
| 6,187,663 B1 | 2/2001 | Yu et al. ............ 438/624 |
| 6,218,299 B1 * | 4/2001 | Akahori et al. ............ 438/682 |
| 6,943,127 B2 | 9/2005 | Cho et al. |

OTHER PUBLICATIONS

PCT International Search Report based on PCT/US05/32382 dated Feb. 21, 2007.

* cited by examiner

*Primary Examiner*—Thanhha S. Pham
(74) *Attorney, Agent, or Firm*—Chinh H. Pham; Greenberg Traurig, LLP

(57) ABSTRACT

A method for fabricating a semiconductor device having a plurality of layers, depositing a first layer comprising a medium-k dielectric barrier layer on one of the plurality of layers, depositing a second layer comprising a low-k dielectric layer on the first layer, and depositing a third layer comprising a medium-k dielectric barrier on the second layer.

9 Claims, 10 Drawing Sheets

Figure 2 (Prior Art) Quasi-Amorphous Graphite-Diamond Carbon.
A schematic structure(x,y) is the substrate plane, z is the growth axis.

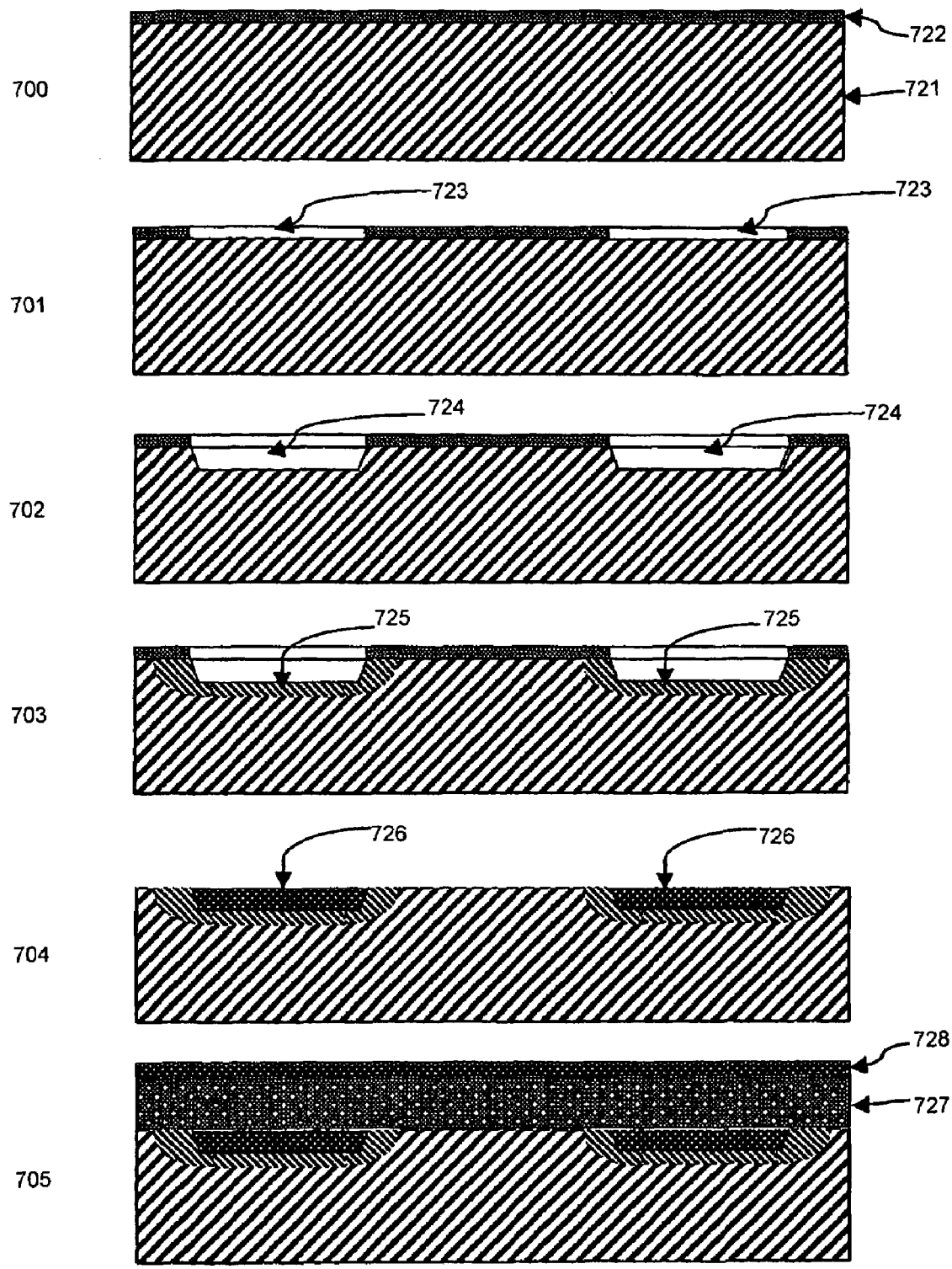
Figure 7, a

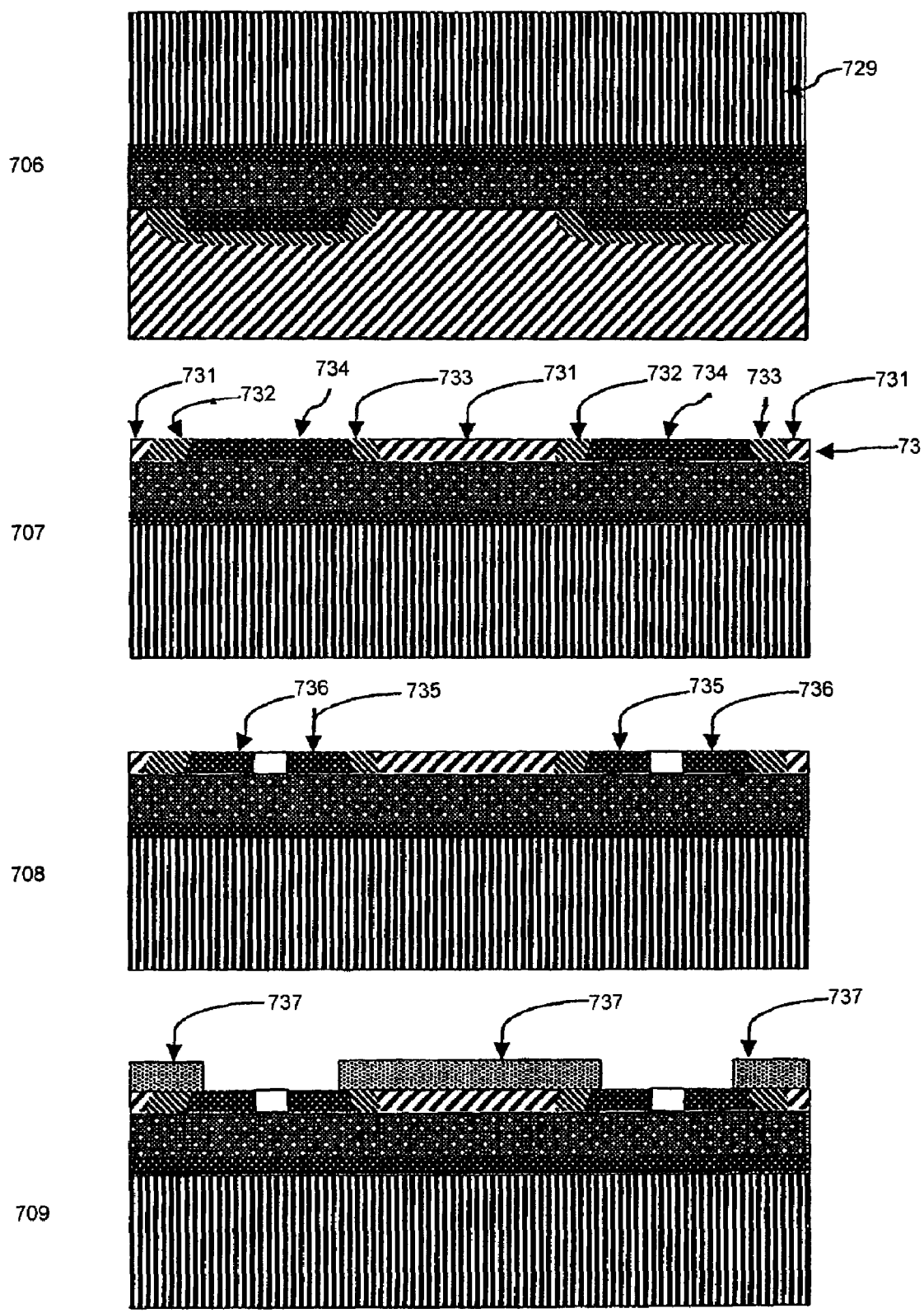
Figure 7, b

SEMICONDUCTOR DEVICES HAVING AMORPHOUS SILICON-CARBON DIELECTRIC AND CONDUCTING LAYERS

RELATED U.S. APPLICATION DATA

This application claims priority to U.S. Provisional Application Ser. No. 60/608,998 filed Sep. 9, 2004.

BACKGROUND OF THE INVENTION

1. Field of the Invention

The present invention relates in general to the manufacture of semiconductor integrated circuits, especially silicon semiconductor integrated circuits.

More particularly, it relates to the dielectric, conducting barrier, and other materials complimentary to silicon that are used in fabricating semiconductor devices and interconnect structures.

2. Description of the Related Art

It was anticipated as early as in 1970s, "If the preceding period of evolution of microelectronics was predominantly associated with development of the technology of active elements, the forthcoming period of its evolution must become essentially development of the interconnect wiring." [B. F. Dorfman, Micrometallurgy in Microelectronics, Moscow, Metallurgy, 1978, p. 260. Monograph in Russian, submitted for publication in December 1976]

For the past 25 years from that time, integrated circuits (IC) have reached a level of integration when the characteristic propagation time of IC is dominated by interconnect delay rather than the device gate delay. In addition, besides the problems of electrical performance of IC, physical-chemical mechanisms of degradation and failures also progressively focus upon in the interconnecting structures.

Replacement of Aluminum wiring with copper wiring improves of the problems of electrical performance since the Copper specific resistivity is 1.725 micro ohm centimeter versus the aluminum specific resistivity of 2.73 3 micro ohm centimeter. Copper also has theoretically favorable ratios of standard reduction potentials (E(Cu)=+0.521 V vs. E(Al)=−1.662 V) and melting points (T(Cu)=1084 C vs. T(Al)=660 C) in comparison with Aluminum. However, Copper does not solve all the problems. The particularities of the copper surface make copper wiring more sensitive to various mechanisms of degradation. Some of these problems include thermal instability, corrosion, electromigration along the lines, and electro-diffusion or ion migration across the interfaces into the dielectric and semiconductor. Additionally, Copper possesses exceptionally poor adhesion to dielectric materials, including and especially to silicon dioxide. All of the above related problems with Copper result in the use of special interface materials, or thin film barriers, to separate copper from both semiconductor and dielectric materials. This complicates the interconnection technology and diversity of materials employed in the interconnection systems. In turn, the vast assortment of varying conducting and barrier materials multiplies the mechanisms of IC degradation and associated reliability problems.

Dielectrics represent the other side of the interconnection technology problems. In fact, while approaching the −0.1 micrometer resolution level, the microelectronics industry split the dielectric technology into a low-k intralevel/interlevel dielectric and a high-k gate dielectric. While the IC frequency performance requires the utmost possible minimum of dielectric constant in intralevel and interlevel insulation, the necessity to block the tunneling mechanism of current leakage suggest an opposite requirement for the ultra-thin gate dielectric.

A demand for a high-k dielectric does not suggest principle problems. Typically high-k dielectric demands are greater than that of silicon oxide and preferably about 20 units or even higher. Therefore it implies a deviation from silicon dioxide as well as additionally complicating technology, varies the materials employed and complicates associated reliability problems.

The demand for a low-k dielectric, i.e., an insulator possessing an effective dielectric constant of about 2.7 in the current technology and eventually down to 2.0 and lower, results in a new diversity of suggested materials. Such diversity may be estimated to number about 200 (based on issued patents, patent applications, and research literature) different materials. This exceeds the diversity of all other basic materials employed in silicon ICs. However, all the suggested low-k materials possess poor mechanical properties. Most of them have very poor thermal stability or experience vapor, water and impurities penetration. Therefore, they require additional medium-k dielectric barriers, which may compound problems.

The continuing progress of IC frequency performance forces the semiconductor industry to find a technical approach which overcomes the physical limits of conventional silicon associated with electron and hole mobility. This was recently found in "strained silicon", in which the silicon crystal lattice period in plane increased due to a built-in strain. Although electron and hole mobility may not be increased equally in strained silicon, there is an increasing characteristic frequency of both p-channel and n-channel transistors, in average up to about a 20% increase. Some optimistic estimates suggest up to about a 50% increase. The strained silicon technology already has over 10 different suggested approaches. All those approaches are based on Si/Si—Ge hetero-structures. Although some approaches suggest replacement of Si—Ge layer on the later stages of the IC fabrication process, the Si/Si—Ge based strained silicon entails a further complication of the technology and generates a new source of undesired impurities and instability.

It is also important to note that the broad variety of employed materials, especially low-k dielectrics, and the more complex diversity of interfaces between these materials decrease the thermal stability of the entire IC structure. At the same time, formation or post-formation stabilization of many components in this structure requires relatively high temperatures. This limits both the flexibility of the IC technology and reliability of the final product.

The further progress of the IC technology demands a family of conformable materials, including an entire array of required dielectrics, as well as allowing formation of a functional layer and the matching barrier in a continuous process. Further, a combination of high thermal stability with a low formation temperature is needed for each structural component of the IC structure.

It was found in the late 1970s—early 1980s that the impact activation of chemical reactions by the incident fluxes of energized particles allows overcoming even the highest activation barriers of surface reactions [B. F. Dorfman et al., Sov. Microelec., 11, 349 (1982). B. F. Dorfman et. al., Impact activation of chemical reactions, Sov. Phys. Docl., 28(9)1983, p. 743-745; Translated by American Inst. of Physics. Original articles: 1982]. In these works, nearly room temperature substrates from siloxane precursors formed silica stabilized diamond-like carbon. In the first work, an ion beam, shooting through a siloxane vapor, produced ultra thin silica-stabilized diamond-like carbon films. In the second work, a remote plasma vacuum CVD was employed to deposit relatively thick silica-stabilized diamond-like carbon films possessing hardness up to about 50 GPa. Films possessing diamond-like properties and characterized with the superposing C-C diamond-like, Si—C carbide-like and Si—O quartz-like bonds were successfully deposited upon metallic, semiconductors (silicon, germanium, GaAs, GaP, InP, InSb, CdS, CdTe, CdSe, crystalline diamond, and silicon carbide) and various dielectrics possessing single crystalline, polycrystalline, amorphous and quasi-amorphous structures. Later, silicon-stabilized diamond-like carbon films and various amorphous phases of C—Si system were deposited with a similar technique from different precursors [B. F. Dorfman, et al, Sov. Tech. Phys. Lett. 14, N5 (1988). Transl. by American Institute of Physics, p. 455-457 (1989).]

Further development of these approaches resulted in three major families of stabilized amorphous carbon materials, differentiated by their atomic arrangement, their content of doping elements, and their physical properties. For Atomic-Scale Composites DLN (also known as Dylyn™) see U.S. Pat. Nos. 5,352,493 and 5,466,431; for Strongly bonded quasi-amorphous QUASAM™, see U.S. Pat. No. 6,080,470; and for metal-carbon composites of atomic scale with a controllable range of electrical conductivity from dielectric, to semiconductor, to electrically conducting metallic range see U.S. Pat. Nos. 5,352,493, 5,466,431 and 6,080,470.

Recently, various amorphous materials of Carbon-Silicon-Oxygen-Hydrogen system have been disclosed in patent applications as the most promising low-k dielectrics by the leading companies in the electronic industry.

Novellus Systems, ASM-Japan, Applied Materials, Trikon Technologies, and Mattson Technology are examples of companies that manufacture semiconductor equipment (i.e., chemical vapor deposition equipment) that can deposit carbon-doped oxides ("CDO"). The Novellus Systems carbon-doped oxide film is marketed under the trademark CORAL™, ASM-Japan carbon-doped oxide film is marketed under the trademark AURORA™, Applied Materials carbon-doped oxide film is marketed under the trademark BLACK DIAMOND™, Trikon Technologies CDO film is marketed under the trademark LOW K FLOWFILL™ and Mattson Technology CDO film is marketed under the trademark GREEN DOT™. All of the above companies' approaches are based on doping silicon oxide with carbon or polymerization of carbon and silicon-containing molecular species.

While the dielectric properties of the films from the above mentioned companies may be acceptable, none of these technologies provides a satisfactory combination of mechanical and electrical properties. Another problem with existing low-k dielectric materials is the absorption of moisture. Various expensive approaches have been suggested, such as post-processing a shallow implantation to form a shallow compact layer over a dielectric by United Microelectronics Corp. (Hsinchu, T W; P6423652 Chang et al. Jul. 23, 2002 438/782). In this process the shallow implantation is carried out using boron ions at an energy level of between about 10 and 50 keV with a relatively high dosage up to 1016 at/cm2.

Recently, Angstrom Systems, Inc. of Santa Clara, Calif., patented a continuous method for depositing a film by a modulated ion-induced atomic layer deposition (Mil-ALD) technique suitable for deposition of various films including low dielectric constant and high dielectric constant films, see U.S. Pat. No. 6,416,822 Chiang, et al. This patent exactly corresponds to the above-referred works found in B. F. Dorfman, et al, Sov. Tech. Phys. Lett. 14, N5 (1988). Transl. by American Institute of Physics, p. 455-457 (1989), while proposing the deposition reaction primarily via substrate exposure to impinging ions wherein the ions are used to deliver the necessary activation energy to the near surface atoms and adsorbed reactants via collision cascades.

International Business Machines Corporation recently patented a low-k dielectric material with inherent copper ion migration barrier. See U.S. Pat. No. 6,414,377, Cohen, et al. An interlayer dielectric for preventing Cu ion migration in semiconductor structure comprises a dielectric material that has a dielectric constant of 3.0 or less and an additive selecting from the group consisting of sulfur compounds, sulfide compounds, cyanide compounds, multidentate ligands and polymeric compounds. The additive is capable of binding Cu ions, as well as being soluble in the dielectric material and being substantially, uniformly distributed throughout the dielectric.

Therefore, having a low-k dielectric materials with an inherent copper ion migration barrier that does not require such undesirable chemicals would be of great technological benefit.

SUMMARY

According to the invention, a method for fabricating a semiconductor device is disclosed having a plurality of layers. The first step includes depositing a first layer comprising a medium-k dielectric barrier layer on one of the plurality of layers. A second step includes depositing a second layer comprising a low-k dielectric layer on the first layer, and a third step includes depositing a third layer comprising a medium-k dielectric barrier on the second layer.

According to another embodiment of the invention, a semiconductor device is disclosed having a plurality of layers, including a low-k dielectric layer and a medium-k dielectric layer, wherein the low-k dielectric layer is positioned between layers of the medium-k dielectric, and the low-k dielectric layer and the medium-k dielectric layer comprise a stabilized amorphous carbon.

According to another embodiment of the invention, a method for fabricating a semiconductor device is disclosed having a plurality of layers. The first step includes depositing a first layer comprising a medium-k dielectric insulation layer on one of the plurality of layers. A second step includes depositing a second layer comprising a low-k dielectric conducting layer on the first layer, and a third step includes depositing a third layer comprising a medium-k dielectric insulation on the second layer.

According to another embodiment of the invention, a semiconductor device is disclosed having a plurality of layers, wherein a conducting layer is positioned between insulating layers. The insulating layer comprises stabilized synergetic carbon and at least a portion of the conducting layer comprises a conducting metal.

BRIEF DESCRIPTION OF THE DRAWINGS

The invention is illustrated in the figures of the accompanying drawings which are meant to be exemplary and not limiting, in which like references are intended to refer to like or corresponding parts, and in which:

FIG. 7 is a cross-sectional step view of a semiconductor device during fabrication comprising active strained silicon regions located on stress-controlling insulating Stabilized Synergetic Carbon.

DETAILED DESCRIPTION

Figure 1:
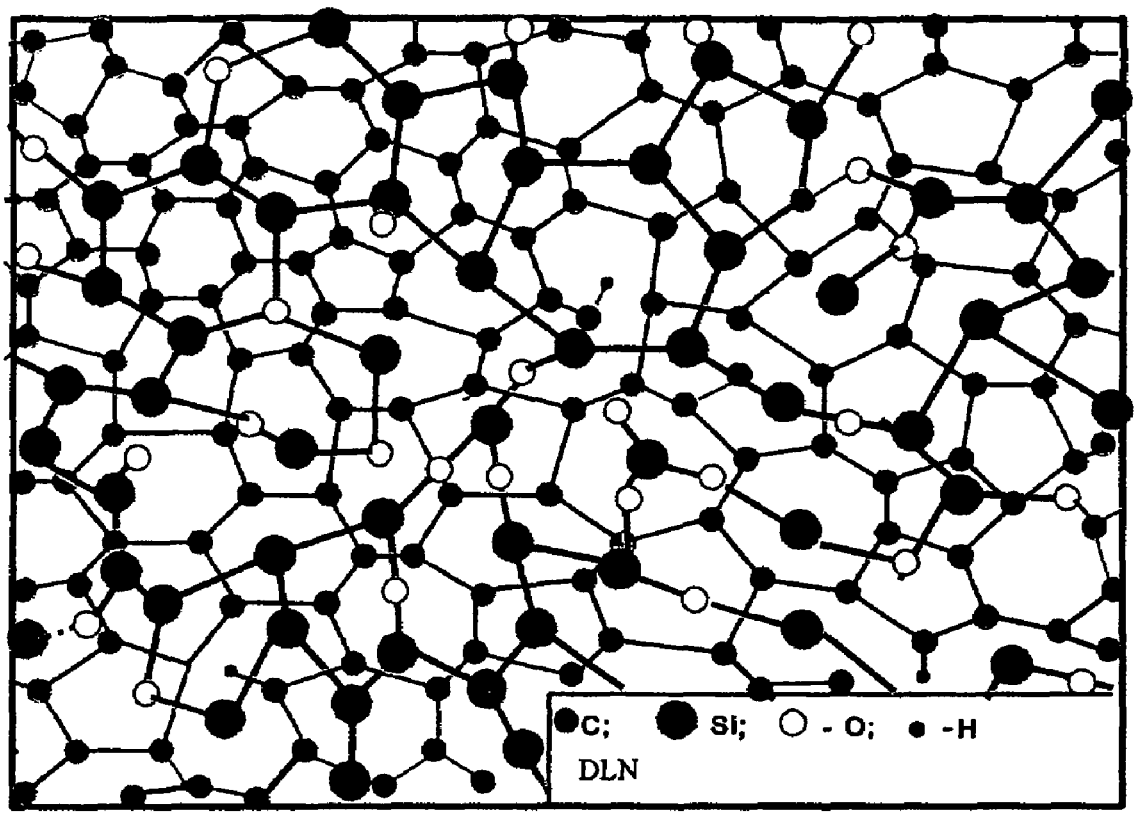
FIG. 1 is a diagram of an example of a prior art atomic arrangement of high density synergetic carbon DLN.
Figure 2:
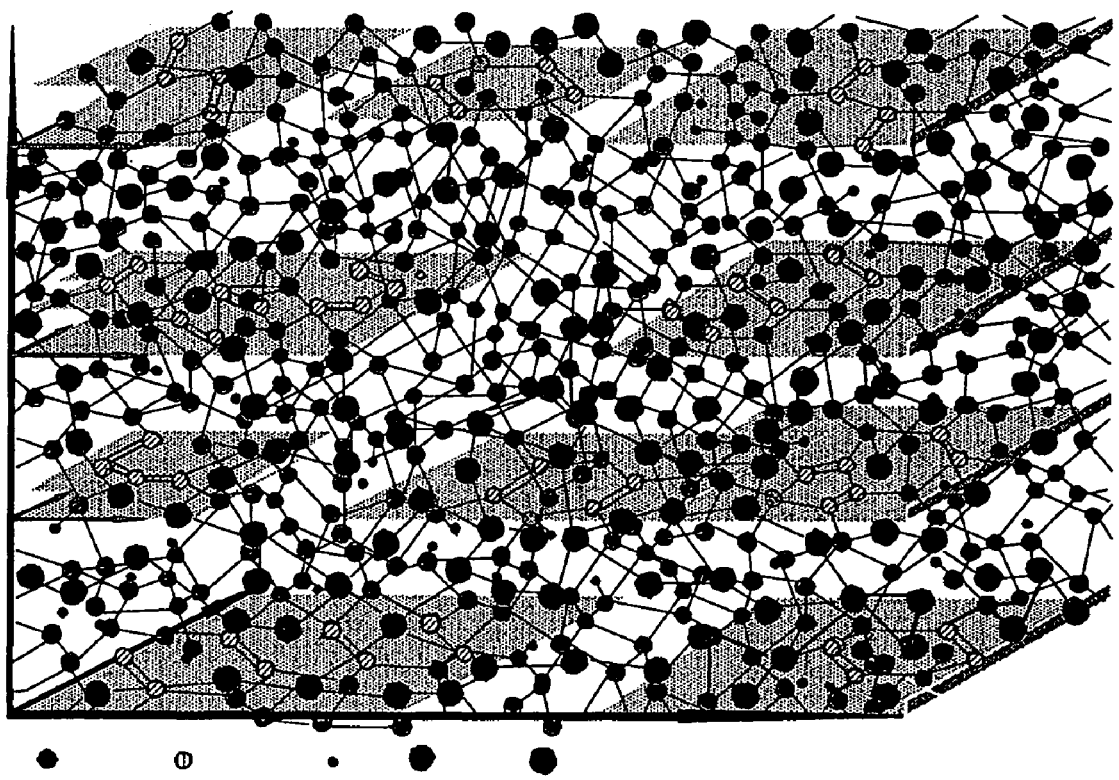
FIG. 2 is a diagram of an example of a prior art atomic arrangement of low density synergetic carbon Quasam™
Figure 3:
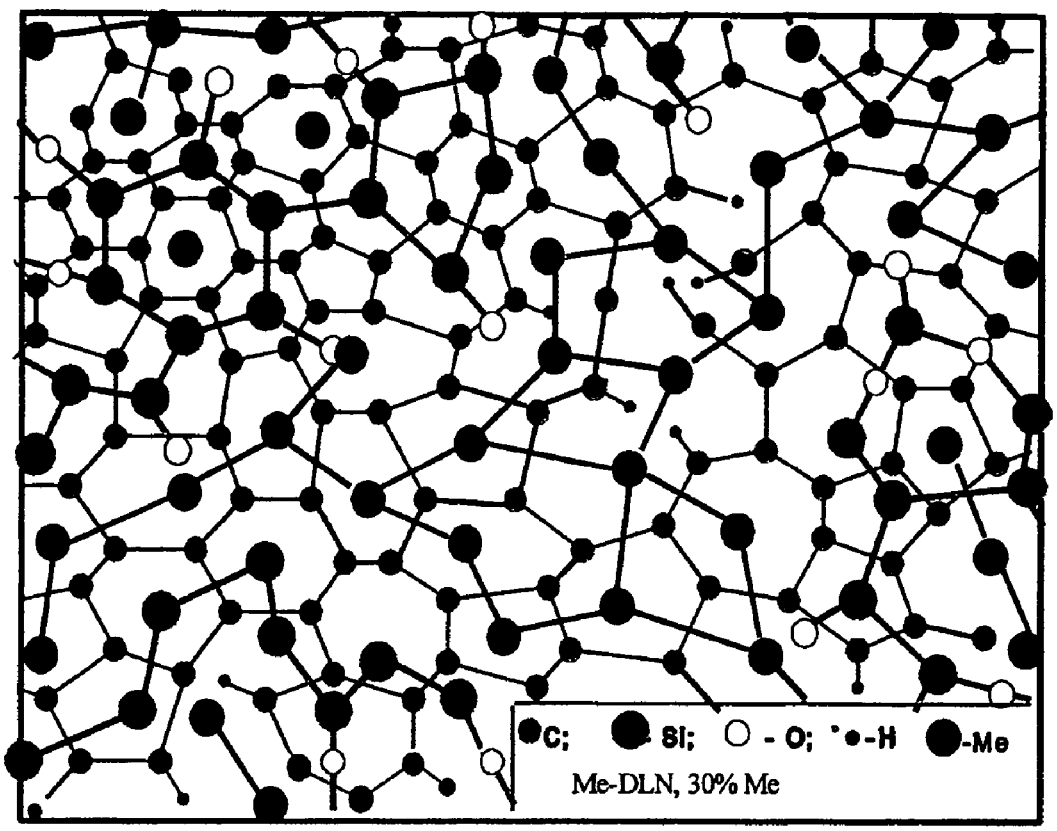
FIG. 3 is a diagram of an example of a prior art atomic arrangement of metal-synergetic carbon stabilized composite of atomic scale. This image corresponds to metal concentration of about 30% atomic.

Definitions:

The following definitions are used to describe the invention in this application:

Heterostructure: a solid structure comprising at least two layers of different materials bonded together with mechanical strength that is equal to or exceeds the tensile strength of at least one of the bonded materials.

Strain-controlling material: one of two materials bonded together in a heterostructure causing a pre-defined mechanical deformation of the second material, in particular, an expansion of atomic lattice of said second material in the directions that are parallel to the interface between two said materials bonded in said heterostructure; said strain-controlling material possesses a value of elastic modules that is at least equal to but preferably higher than the value of elastic modules of said second of two said bonded materials.

High-k dielectric: a dielectric material possessing the value of dielectric constant that is equal to or exceeds 6.0, typically equal to or exceeding 7.0.

Medium-k dielectric: a dielectric material possessing the value of dielectric constant in the range of from about 3.0 to about 6.0, while typically in the range of 4.0 to 5.0.

Low-k dielectric: a dielectric material with a dielectric constant value less than 3.0.

Ultra low-k dielectric: a dielectric material possessing the value of dielectric constant less than 2.2.

Effective k-value: a calculated effectual technical characteristic of dielectric insulation comprising at least two layers of different dielectric materials, and/or at least one functionally graded dielectric material, and/or at least one dielectric material comprising of air pores or cavities of any size, and/or at least two dielectric layers separated by an air gap the effective k-value calculated assumes that the insulation acts as a virtual bulk uniform dielectric material.

Partially freestanding wiring: interconnecting wiring in integrated circuits, any semiconductor, or solid state device comprising at least one conducting line separated from the substrate by an air gap along the part of the line exceeding at least double minimum distance between the parallel conducting lines in the integrated circuit, semiconductor, or solid state device.

Strained wiring: a partially freestanding interconnecting wiring in integrated circuits, semiconductor, or solid state device comprising at least one conducting line with a pre-defined mechanical deformation by tensile stress along its length at least in the part separated from the substrate by an air gap.

Active region: an area of pre-defined geometry, typically a doped semiconductor area, which transforms or transmits electronic signals.

Functional layer: a layer with pre-defined semiconducting, conducting or insulating properties comprising at least half, but typically a major portion of thickness of any predefined semiconducting, conducting, or insulating layer.

Barrier layer: a layer comprising a minor portion, typically less than 1% of thickness of any functional layer, which protects this or an adjacent layer from diffusion, electro-diffusion, absorption, deep penetration of undesired impurities, mechanical impact, or from chemical attack.

Poro-forming component: any component, including individual elements, chemical compounds, radical species, and/or clusters which are temporally introduced during the initial stage of forming a low-k or ultra low-k dielectric and successively removed from the structure leaving pores of any size.

Stabilized Synergetic Carbon ("SSC"): amorphous carbon materials comprising a synergetic structure of "graphene-like" sp2 bonds predominantly oriented parallel to the substrate directions, and a three dimensional network of "diamond-like" sp3 covalent bonds. The amorphous carbon materials are stabilized by silica or silicon, while the silica is the most preferable stabilizing component. These carbon materials will be referred to as Stabilized Synergetic Carbon or "SSC" in this application.

Stabilized Amorphous Carbon Materials

There are at least three major families of stabilized amorphous carbon materials, differentiated by their atomic arrangement, their content of doping elements, and by physical properties, as follows:

1. The most typical family is a strongly bonded quasi-amorphous structure, also known as QUASAM™, with a density below 1.9 g/cm$^3$. A density range of 1.35 to 1.75 g/cm$^3$ is more typical. The QUASAM™ materials possess a quasi-periodic hierarchical structure, where the graphene planes are bonded together by a diamond-like three-dimensional network penetrating a entire diamond-graphene synergetic structure. The silica network is strongly bonded with the carbon network. The materials possess a slight one-axis anisotropy. The QUASAM™ adhesion to silicon exceeds the innate silicon strength, and the QUASAM™ coatings increase thermal shock and fracture toughness of silicon.

2. The Atomic-Scale Composite structures family, known as DLN (also known as Dylyn™) typically have a density range of 1.9 to 2.25 g/cm$^3$. The density range of 2.1 to 2.23 g/cm$^3$ is the most typical. In DLN, the entire structure is completely amorphous with the diamond-like network, the graphene planes, and the silica network only partially bonded.

Both of the graphene-diamond-like synergetic carbon materials QUASAM™ and DLN consist of carbon, silicon, oxygen, and a variable content of hydrogen. Undoped QUASAM™ and DLN™ are typically pore-free dielectrics. They generally possess barrier properties against water, vapor, and various aggressive chemicals. Additionally, both QUASAM™ and DLN™ possess excellent barrier properties against metal diffusion of at least up to 600 to 800 degree C.

3. The Stabilized Synergetic Carbon family comprises additional doping elements, such as copper, tungsten, chromium, molybdenum and other metals or intermetallic compounds, especially high melting transition metals, carbides, and silicides.

As the result of extensive research of Stabilized Synergetic Carbon based materials over the past decade, Atomic-Scale Design systematically explored their electrical, mechanical, chemical, and barrier properties for fabricating semiconductor devices, especially silicon integrated circuits. This research further explored the synergetic synthesis of SSC and doped SSC. The synthesis combined both thermal and impact activation of the surface chemical reaction on the front of the synthesizing material. The thermal-impact activation synergy allows a simultaneous drastic decrease of both substrate temperature and the impact (accelerated flux) energy. This allows depositing undoped and doped SSC with pre-defined electrical, mechanical, and other properties upon fabricated active regions of semiconductor devices and various components of the interconnect system. It also saves energy costs, simplifies the equipment, and prevents radiation damage of the semiconductor.

Undoped Stabilized Synergetic Carbon materials, as well as many doped SSC materials, are characterized by exceptionally strong adhesion to silicon, silicon oxide, and various other metals. SSC generally is stabilized by silica or silicon. Silica is the most preferable stabilizing component.

While controllably changing the content of metallic alloying elements from about 35% to 45% of the combined content of carbon, silicon, oxygen and alloying elements (excepting hydrogen), the electrical conductivity of doped SSC may be varied from a dielectric to an electrically conducting metallic range semiconductor. Depending on the kind of metal, the conditions of material deposition, and the post-deposition treatment, the metallic component may be incorporated in the ASC structure as the additional atomic-scale composite network. It may also be strongly bonded with the carbon and silica networks.

Stress in the dielectric SSC/silicon hetero structures and in the conducting doped SSC/silicon hetero structures is controllably variable from about 0.2 GPa compressive to about 0.1 tensile.

The SSC materials generally possess hardness in the range of 12 GPa to over 50 GPa and an elastic modulus in the range of 100 GPa to over 500 GPa. The hardness in the range of 18 GPa to 35 GPa and an elastic modulus in the range of 150 GPa to 250 GPa are the most typical.

The dielectric constant on undoped SSC is in the range from a relatively low value range of 3.5-4.5 to a relatively high value range of 8.0-10.0. The values of 4.5 to 5.0 are most typical.

The electrical resistivity of these dielectric materials are in the range of $10^{11}$ to $10^{14}$ Om.cm. The electrical strength is typically about $1.10^{7}$ V/cm to $2.10^{7}$ V/cm.

The maximum temperature characterizing the long-term thermal stability of SSC is generally from about 470 degree C. to about 750 degree C., depending on the specific structure and growth conditions of SSC. The short-term thermal stability given approximately a half-hour (1/2 hr.) exposure without damaging electrical and mechanical properties is correspondingly from about 600 degree C. to 800 degree C.

A very short exposure, typically approximating one minute, does not essentially deteriorate the electrical and mechanical properties of SSC above 1000 degree C.

An SSC layer may also be used to form a porous insulating layer. The size of pores in the SSC layer are predominantly in the atomic-scale range and at least 50% of the entire volume of the pores are occupied by pores with a mean diameter not exceeding 0.5 nm. Additionally, the size of the pores may be predominantly in the nano-scale range, where at least 50% of the entire volume of the pores have a mean diameter not exceeding 0.5 nm. At least 90% of the entire volume of the pores are occupied by pores with a mean diameter not exceeding 100 nm. If the SSC layer comprises of pores predominantly in the low nano-scale range, then at least 50% of the entire volume of the pores have a mean diameter not exceeding 5 nm. Finally, if the size of pores is predominantly in the nano-scale range, then at least 90% of the entire volume of the pores have a mean diameter not exceeding 20 nm.

The fabrication of a semiconductor may comprise at least one layer of a high-k dielectric, where the high-k dielectric layer may consist of either undoped or doped SSC. The undoped Stabilized Synergetic Carbon possesses a value of dielectric constants no less than 7, and preferably is in the range of from about 8 to about 14. Doped SSC typically contains metal oxides selected from the transition metals of groups 3, 4, 5, or 6, singularly or in combination, e.g., oxides of Ti, Zr, Hf, Nb, Ta, Cr, Mo, W, Y, Sc, La, and/or rare earth metal. Additionally, the doped SSC generally possesses a value of a dielectric constant no lessen than 10, but preferably at least 15, and more preferably greater than 20. At these levels, the high-k undoped or doped SSC acts as transistor gate dielectric.

The fabrication of a semiconductor may comprise at least one layer of a low-k or ultra low-k dielectric. The stabilized amorphous carbon is used as both a low-k dielectric and as a multifunctional self-conformal dielectric, typically conducting and having strain-controlling materials for integral circuits. This layer may consist of Stabilized Synergetic Carbon. Undoped Stabilized Synergetic Carbon materials can be used as a dielectric, as a multifunctional self-conformal component of the interconnection system in integral circuits of a semiconductor and as a strain-controlling coating for active semiconductor layers.

In general, a SSC layer may be used as a low-k dielectric, where the SSC possesses a value of a dielectric constant not exceeding 3.0, preferably not exceeding 2.5, and still more preferably not exceeding 2.0. Typically, the content of carbon bonded by sp3 covalent (or diamond-like) bonds is at least 10%. Preferably, it is at least 25% of the sum of all carbon, silicon, and oxygen content. The content of carbon bonded by sp2 (or graphene-like) bonds is at least 10%, but preferably it is at least 25% of the sum of carbon, silicon, and oxygen content. The combined content of silicon, and oxygen is at least 10%, but preferably is about 25% of the total sum of carbon, silicon and oxygen content. The atomic percentage of hydrogen does not exceed the atomic percentage of carbon, and more preferably is below 0.5 of the atomic percentage of carbon. It may be below about 0.1 of the atomic percentage of carbon. The combined content of doping elements typically does not exceed 45% of the combined content of the sum of all elements, excepting hydrogen, but it may be as high as 75% of the combined content of all elements, excepting hydrogen. Additionally, this embodiment generally enables a stable pore-free nearly-atomically uniform amorphous structure.

A low-k or ultra low-k porous dielectric SSC may be used as an insulating layer. In some cases, where the SSC comprises pores, the relative combined volume of all the pores typically comprise at least 10% of the entire volume, but preferably exceeds 25% of the entire volume of the SSC insulating layer.

The SSC insulating layer may also be a pore-free Stabilized Synergetic Carbon barrier layer. In some embodiments, the undoped pore-free SSC acts as a low-k and a medium-k dielectric barriers, as well as a high-k dielectric, such as that used for a transistor gate dielectric. The pore-free SSC barrier layer typically has a dielectric constant not exceeding 5, an elastic modulus of at least 50 GPa, and generally a thickness not exceeding 20% of the thickness of the low-k dielectric, but preferably not exceeding 5% of the thickness of low-k dielectric. A pore-free low-k or medium-k dielectric SSC barrier is fabricated by variations of synergetic parameters. These may include, but are not limited by, differences in the accelerating field between the cathode of plasmatron and the substrate holder, or the substrate temperature for the deposition process.

In some embodiments, an undoped pore-free medium-k dielectric SSC may act as a water/vapor barrier or a mechanical barrier by reinforcing and protecting low-k or ultra low-k dielectrics. In addition, an undoped pore-free medium-k dielectric SSC may act as a diffusion barrier, where the diffusion barrier prevents the atomic diffusion and ion electro-diffusion penetration of copper or other impurities into the low-k or ultra low-k dielectric or semiconductor.

A SSC layer may be used as a conducting layer, where the SSC is doped with a metal or a combination of metals. Typically the SSC conducting layer is a synergetic structure of "graphene-like" sp2 bonds predominantly oriented parallel to the substrate direction, and a three dimensional network of "diamond-like" sp3 covalent bonds. The carbon-bonded sp3 covalent (or diamond-like) bonds are at least 10%, but preferably are at least 25% of the sum of carbon, silicon, oxygen, and doping element content, excepting any hydrogen content. The content of carbon bonded by sp2 (or graphene-like) bonds is at least 10%, but preferably is at least 25% of the sum of carbon, silicon, oxygen, and doping elements, excepting any hydrogen content. The combined content of silicon and oxygen is at least 10%, but preferably is about 25% of the sum of carbon, silicon, oxygen, and doping elements, excepting any hydrogen content. The atomic percentage of hydrogen does not exceed the atomic percentage of carbon, and preferably is below about 0.5 of the atomic percentage of carbon. It may be below 0.1 of the atomic percentage of carbon. The combined content of doping elements typically does not exceed 45% of the combined content of the sum of all elements, excepting hydrogen, but it may be as high as 75% of the combined content of all elements, excepting hydrogen.

Generally, the built-in atomic scale silica network prevents crystalline graphite formation, thus stabilizing both the graphene mesophase and three-dimensional diamond-like framework. This results in a shift of graphite-diamond equilibrium and allows the existence of stress-free form diamond-like carbon, i.e. QUASAM™ (contrary to the stress-stabilized conventional DLC). Consequently, this stability enables freestanding diamond-like material fabrication and eliminates the material thickness limitation. Over 300-mm thick QUASAM™ layers may be grown upon silicon substrates. In addition, the synergy resulting from the strongly bonded three-dimensional diamond-like framework and mesoscopic graphene planes in QUASAM™ exploits the strongest features of both diamond-like matter (as DLC) and semi-ordered graphene planes (as nano-tubes in macro-assembly). The stabilized diamond-like and synergetic diamond-graphene carbon may be synthesized by vacuum deposition from the predominantly low-molecular radical ions like $CH^{*+}$, $SiO^{*+}$ in a D.C. accelerating field.

In another embodiment, the conducting SSC layer may include interconnect wiring which may contain a conducting barrier film. Therefore, the doped conducting SSC layer may comprise metallic elements such as copper, tungsten, chromium, molybdenum, and any other hard-melting transition metals, either singularly or in combination.

Additionally, the interconnect wiring may have a partial air gap insulation between the lower level of the interconnect wiring and the substrate. Typically, the interconnect wiring has a built-in tensile stress not exceeding 0.08 GPa, but preferably not exceeding 0.05 GPa. In one embodiment, the built-in tensile stress may be provided by one of the techniques that includes doping the conducting barrier coatings with metal or metals possessing large atomic diameters, such as Hf and/or Zr. The partially freestanding wiring may not be encapsulated, i.e. coated with an underlying layer, with a top-cover layer or coated along the interconnect line edges.

According to one of the embodiments of the present invention, a semiconductor device is formed comprising at least one insulating layer consisting of Stabilized Synergetic Carbon and at least one conducting layer consisting of Stabilized Synergetic Carbon. The conducting layer may be doped with a metal or a combination of metals. The copper interconnection wiring is situated between an underlying barrier and an overlying barrier consisting of either an undoped or doped Stabilized Synergetic Carbon.

Figure 4:
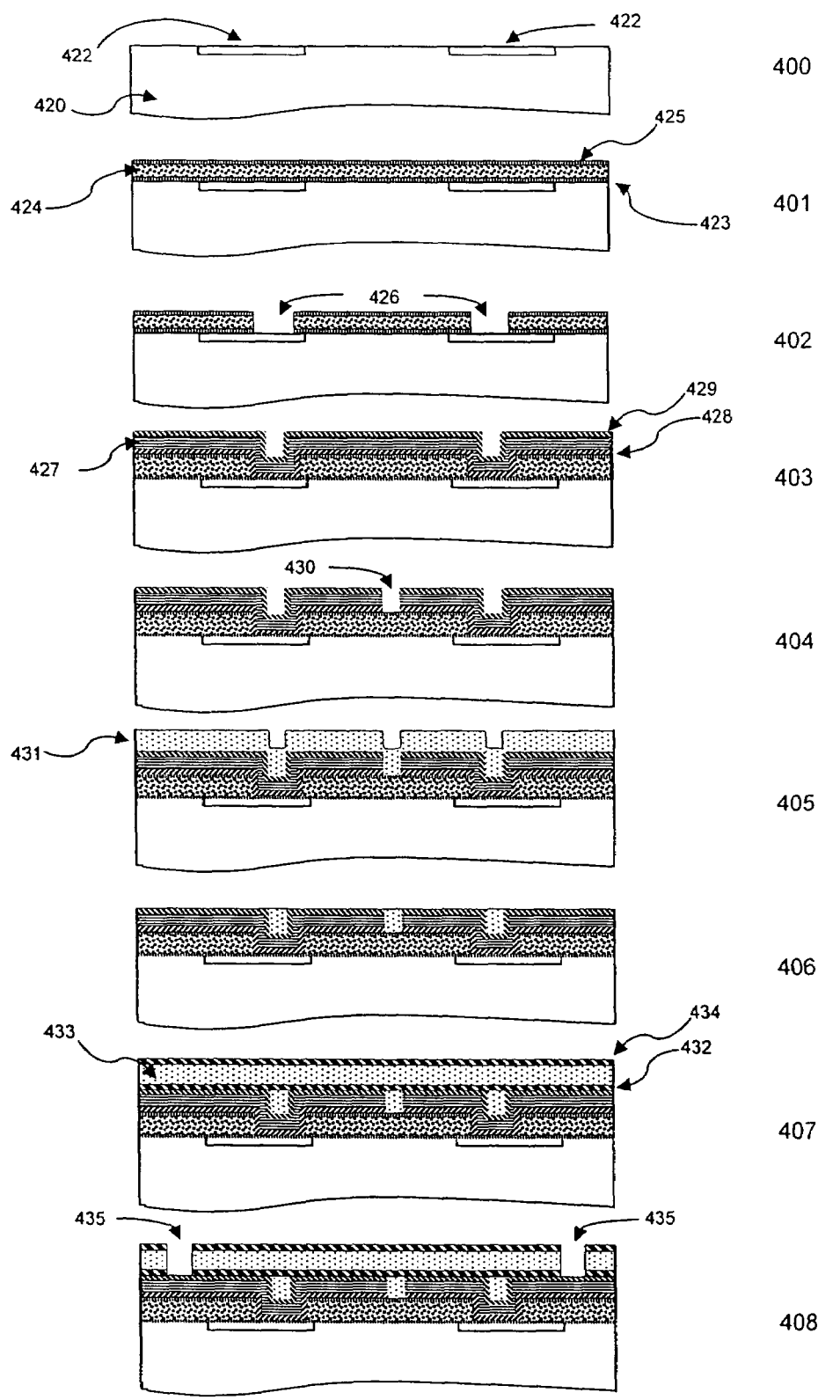
FIG. 4 is a cross-sectional step view of a semiconductor device during fabrication comprising the encapsulated copper interconnecting wiring and two encapsulated ultra low-k dielectric layers.

FIG. 4 shows an exemplary method of fabricating a semiconductor device comprising the encapsulated copper interconnecting wiring and two encapsulated ultra low-k dielectric layers fabricated according to the methods of the present invention. FIG. 4 starts with a preliminary fabricating stage 420 and a provided interconnect level with interconnect lines 422, and then shows a series of steps in assembling the exemplary invention via a simplified cross-section of the device. The assembling can be done by any one of a number of well known techniques, including plasma enhanced vacuum (CVI) techniques or by vacuum PECVD/PVD techniques combined with PVD techniques. The preliminary fabricating stage 420 has a medium-k dielectric SSC underlying barrier 423, an ultra low-k dielectric SSC 424 and a medium-k dielectric SSC top barrier 425 deposited upon it in step 401 via a technique such as PECVD. A technique such as chemical plasma etching is done through the combined medium-k dielectric SSC underlying barrier 423, the ultra low-k dielectric SSC 424 and the medium-k dielectric SSC top barrier 425 forming holes 426 as shown in step 402. Step 403 shows a doped dielectric SSC (W-SSC) conducting underlying barrier 428, a copper conductor 427, and a capping doped SSC (Cr-SSC) conducting 10-nm top barrier 429 deposited upon the device, respectively. A technique such as ion bombardment is used to etch through the conducting layers (doped dielectric SSC conducting underlying barrier 428, copper conductor 427, and doped SSC conducting barrier 429) to form intralayer gaps 430 defining individual conducting lines in step 404. An intralevel low-k dielectric atomic-scale porous SSC 431 is then deposited upon the device to fill the intralayer gaps 430 in step 405. Step 406 shows a planarization technique, such as by the damascene technique, acted against the device. At Step 407, a dielectric atomic-scale porous SSC barrier layer 432, a low-k dielectric atomic-scale porous SSC layer 433, and a capping dielectric under-layer SSC barrier 434 are deposited on the device, respectively. These layers, dielectric atomic-scale porous SSC barrier layer 432, low-k dielectric atomic-scale porous SSC layer 433, and capping dielectric under-layer SSC barrier 434, are referred to as the interlevel dielectrics. A technique for etching through the dielectric layers, such as plasma etching, is shown in Step 408. The etching technique acts against the interlevel dielectrics to form a contact hole 435. The capping doped SSC (Cr-SSC) conducting top barrier 449 acts as an etch-stopping layer. These contact holes 435 provide interlevel contacts between wiring traces.

Additionally, the wiring traces may have a partial air gap insulation, where the air gap is provided as an inlayer insulation. Other embodiments may have partially freestanding thin film wiring. In other embodiments, at least one interconnection layer is partially separated with air gaps in the layer and from lower conducting layers. The partially freestanding thin film wiring has a tensile stress not exceeding 0.08 GPa, but preferably not exceeding 0.05. This stress can be provided by a variety of techniques, such as one that alloys the conducting barrier coatings as described above, with metal or metals possessing large atomic diameters, such as Hf or Zr. This pre-defined limited tensile stress typically supports the partially freestanding wire in a straight line position preventing it from contacting or touching the lower wiring. Other methods used to secure the inter-layer insulation is to encapsulate the partially freestanding wiring interconnect, i.e., to coat the wiring interconnect with an underlying layer, with a top cover layer, and along the interconnect line edges with SSC dielectric barrier film. Thus, even if the freestanding wiring and the lower level interconnect accidentally contact each other, a short circuit cannot occur. Another technique to partially insulate the wiring from the lower layer by an air gap insulation is generally known from prior art for removable, or sacrificial material as a temporal inter-layer spacer feasible for damascene technology. For instance, a removable spacer material is selected from the group including, but not limited to, silicon oxide and metals (such as aluminum, copper) and then the removable spacer material is selectively etched off after the wiring formation is completed.

Figure 5:
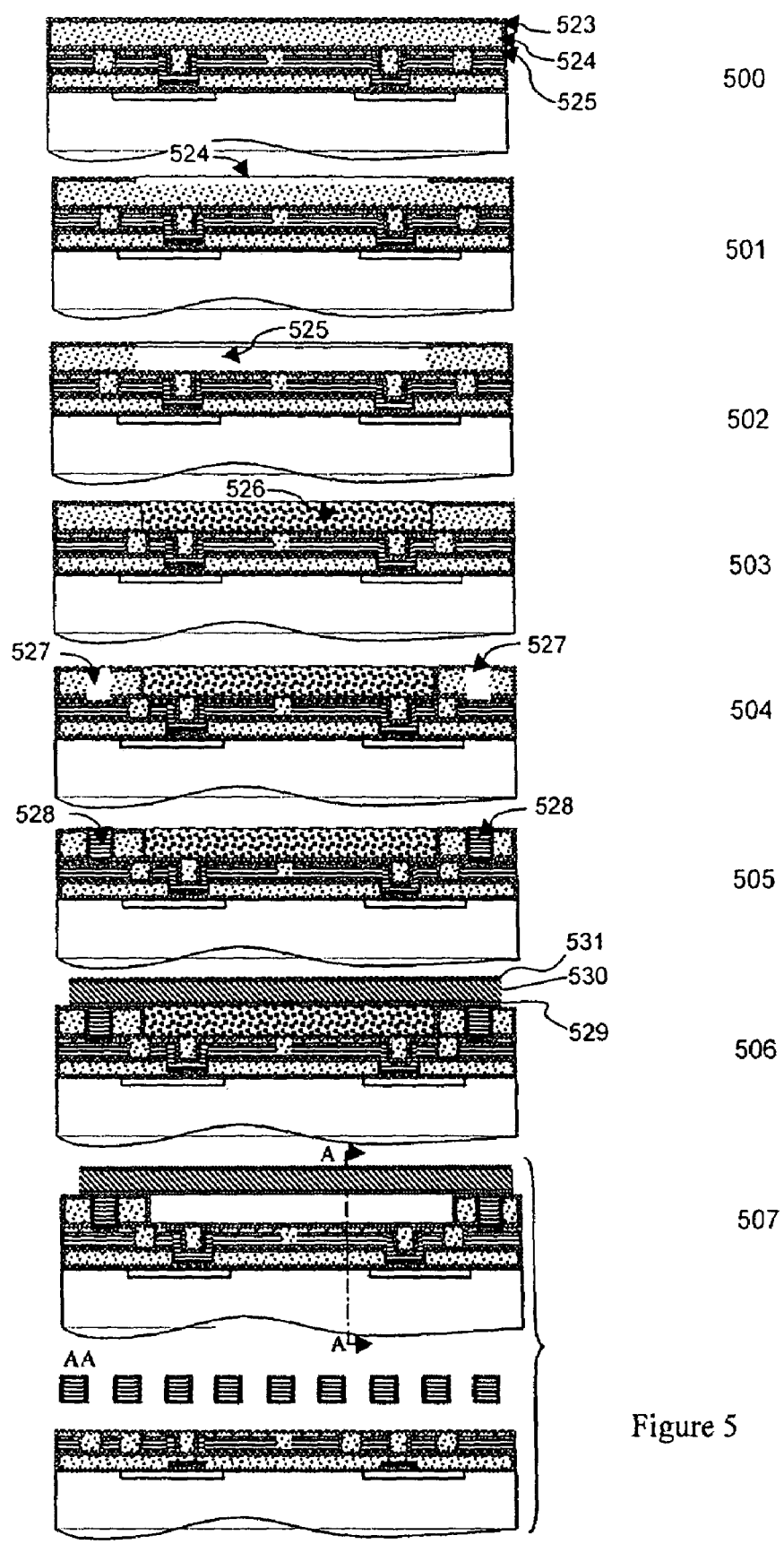
FIG. 5 is a cross-sectional step view of a semiconductor device during fabrication comprising a partially freestanding interconnecting wiring.

FIG. 5 shows an exemplary method of fabricating a semiconductor device comprising partially freestanding interconnect wiring. FIG. 5 starts with a semiconductor device with first interconnect layers and a low-k dielectric SSC interlayer 522 in step 500, where the low-k dielectric SSC 522 is encapsulated between a medium-k dielectric SSC underlying barrier 520 and a medium-k dielectric SSC top barrier 523. In some embodiments, the low-k dielectric SSC 522 may be an ultra low-k dielectric SSC. A technique such as chemical plasma etching is done through the medium-k dielectric SSC top barrier 524 forming holes 525 as shown in step 501. A technique such as chemical etching is done through the low-k dielectric SSC interlayer 522 as shown in step 502. The medium-k dielectric SSC underlying barrier 520 acts as an etch-stopping layer. A gap filling temporary underlying material 526 is then deposited upon the device to fill the holes 525 in step 503. A planarization technique, such as by the damascene technique, is acted against the device. A technique for etching through the dielectric layers of low-k dielectric SSC interlayer 522, medium-k dielectric SSC underlying barrier 520 and medium-k dielectric SSC top barrier 524, such as plasma etching, is shown in Step 504. This etching action creates separating trenches through the dielectric layers. In some embodiments, a capping conducting Cr-SSC barrier may act as an etch-stopping layer. In other embodiments, Stabilized Synergetic Carbon materials, and especially QUASAM™ act as etch stopping materials. Step 505 shows the depositing of the interlayer contacts 528, typically comprising of a doped dielectric SSC (W-SSC) conducting underlying barrier, a copper conductor, and a capping doped SSC (W-SSC) conducting top barrier, respectively. A planarization technique, such as by the damascene technique, is then acted against the device. Step 506 shows the depositing and patterning of a second level copper interconnect 530 encapsulated within a doped dielectric SSC (W-SSC) conducting underlying barrier 529 and a doped dielectric SSC (W-SSC) conducting top barrier 531. Removing (etching off) the temporary gap-filling material is shown in step 507. The top copper interconnect lines are partially freestanding, being supported at either end by interlayer contacts 528. This is shown in section AA at the bottom of FIG. 5. In section AA the assembled device is rotated 90° about the vertical axis, showing individual freestanding copper interconnects 530 in cross section.

Stress in conducting lines should not exceed 0.1 GPa, but preferably does not exceed 0.02 GPa. This type of stress should not produce deformation of the semiconductor wafer. In other embodiments, initial lines are virtually free from stress and only after the final steps of the patterning assort annealing would a pre-defined stress be produced.

In addition, both undoped and doped pore-free Stabilized Synergetic Carbon materials may act as electromigration suppressing barriers. The barrier stabilizes the surface of a conductor, such as the copper interconnect 530. The barrier also restrains electromigration, prevents current-stimulate deterioration, prevents void formation, and failure of the copper interconnects 530.

In some embodiments, metal doped Stabilized Synergetic Carbon materials generally act as the contact barrier between a semiconductor and metals (such as copper) of the interconnect wiring of the semiconductor device. This barrier prevents penetration of copper and other undesired impurities into the semiconductor by diffusion or ion migration/electro-diffusion.

Additionally, doped and undoped silica-stabilized amorphous carbon may be employed as a strain-controlling material for the partially freestanding interconnect wiring with partial interlevel and intralevel air gap insulation.

Figure 6:
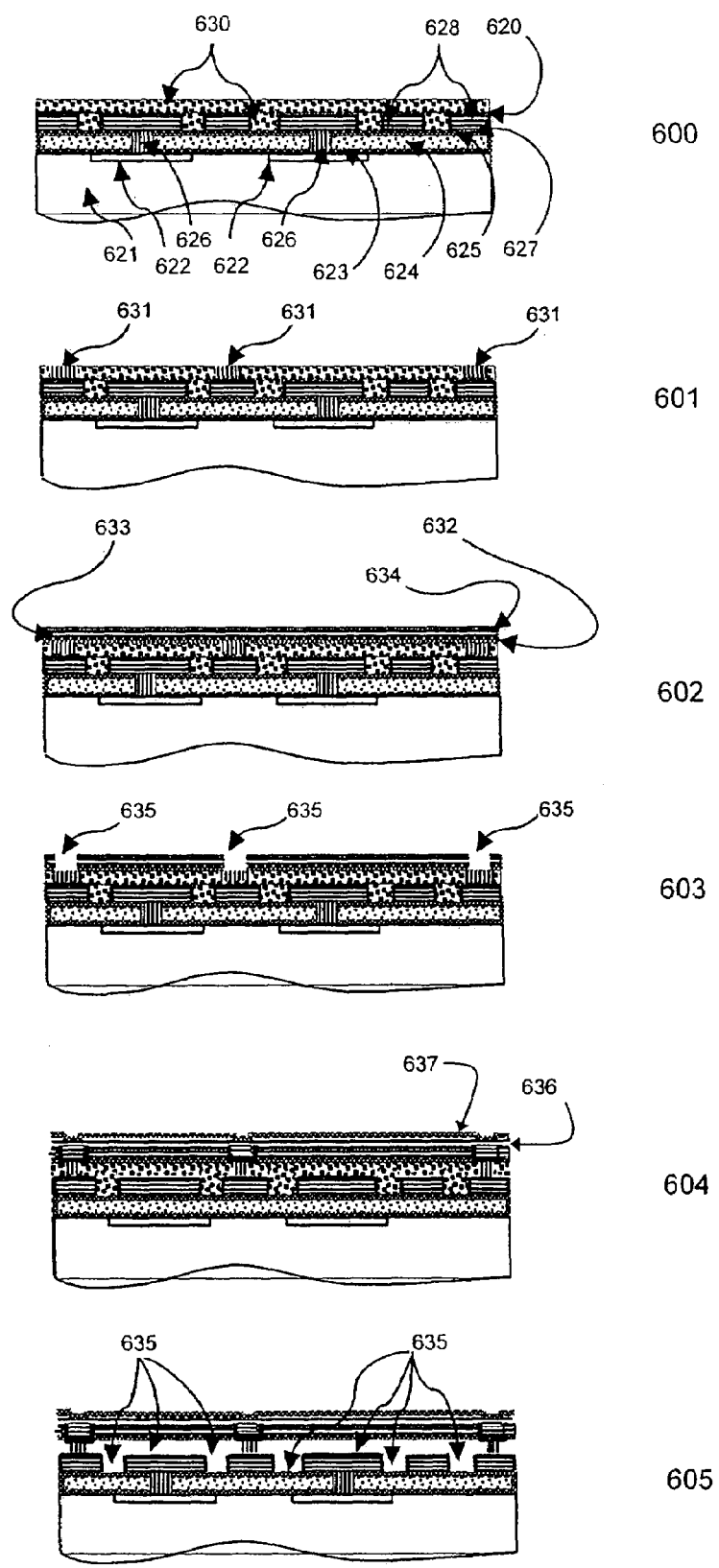
FIG. 6 is a cross-sectional step view of a semiconductor device during fabrication comprising an encapsulated interconnect wiring with partial air gaps intralayer and interlayer insulation.

FIG. 6 shows an exemplary method of fabricating a semiconductor device comprising an encapsulated interconnect wiring with partial air gap intralayer and interlayer insulation.

FIG. 6 starts with previously formed active regions, electrodes, a first layer of interconnect, and temporal intralayer/interlayer spacer material in step 600. The preliminary fabricating stage 620 includes a interconnect level with interconnect lines 622, a medium-k dielectric SSC underlying barrier 623, a low-k dielectric SSC 624, a medium-k dielectric SSC top barrier 625, an interlayer contact 626, a doped dielectric SSC conducting underlying barrier 627, copper interconnect lines 628, a doped dielectric SSC conducting top barrier 629 and a temporal space/filler material 630. In step 601, interlayer contacts 631 are formed by generally well-known standard techniques. A triple-strained layer comprising of a dielectric SSC underlying strained insulating barrier 632, a partial sublayer of the copper interconnect 633, and a doped dielectric SSC reinforcing interface conductor barrier 634 are formed in a continuous vacuum process in step 602. A technique such as ion bombardment is used for standard ion etching and masking techniques to etch off a contact hole 635 as shown in step 603. Step 604 shows the creation of a double strained layer comprising the remaining sublayer of the copper interconnect 636 and a capping dielectric SSC strained insulating barrier 637 formed in a continuous vacuum process. The temporal intralayer/interlayer spacer material is etched off by selective chemical etching using a standard etching technique to produce intralayer and interlayer insulating air gaps 638 as shown in step 605.

FIG. 7 starts with a silicon wafer 721 and a 1-micrometer thick SSC hard (30 GPa) layer 722 deposited on the silicon wafer as shown in step 700. Step 701 shows holes 723 etched into the hard mask formed by the SSC hard layer 722. Vales 724 are etched anisotropically through the holes 723 in step 702. In step 703, active regions 725 for sources and drains are doped by diffusion using the same mask. A conducting tungsten-SSC layer 726 is deposited on the device and the structure is planarized in step 704. The SSC hard layer 722 acts as a CMP controlling layer during the final stage of chemical-mechanical polishing. Step 705 shows a silicon strain controlling 10-micrometer thick medium-k dielectric SSC 727 deposited by a technique such as PECVD. In addition, a copper-SSC 2-micrometer thick interlayer 728 is deposited. Both the medium-k dielectric SSC 727 and the copper-SSC interlayer 728 are deposited in two steps of one continuous vacuum process. A heat sink 729 is bonded to the copper-SSC interlayer 728 in step 706. In some embodiments, the heat sink may be a metallic heat sink, a heat sink made of crystalline diamond, a heat sink maid of sapphire, or a thermally highly conductive ceramic heat sink.

The silicon wafer is etched off or polished up to the active regions 725 in step 707. The conducting tungsten-SSC layer (W-SSC) 726 acts as the etching- or CPM-stopping material. Step 707 additionally shows channel areas 731, source 732, and drain 733 areas of the active regions 725 and the electrode areas 734, in which the source and drain electrodes are not yet separated. Step 708 shows the electrodes separated into sources 735 and drains 736. Step 709 shows a high-k dielectric SSC gate as the finished product.

In one embodiment of the invention, a semiconductor device is formed with a heterostructure comprised of strained silicon layer and strain-controlling dielectric layer. The strain-controlling dielectric layer may consist of stabilized amorphous carbon layer, which typically possesses a medium value of dielectric constants in the range of 3 to 6, preferably in the range of 4 to 5. One method of fabricating the heterostructure comprised of strained silicon layer and strain-controlling dielectric layer comprises the steps of:

1. Depositing a strain-controlling dielectric layer on the silicon substrate; 2. Removing a portion of the thickness and polishing the silicon substrate by any prior art techniques; 3. Forming the electrodes and wiring on the polished side of said semiconductor device.

Other methods to form the heterostructure semiconductor device may comprise the steps of:

1. Forming the active regions, including but not limited to the source and drain regions of field-effect transistors, in the silicon substrate prior to depositing a strain-controlling dielectric layer on the silicon substrate; 2. Depositing a strain-controlling dielectric layer on the silicon substrate over the active regions; 3. Removing a portion of the thickness and polishing the silicon substrate by any prior art techniques; 4. Forming the electrodes and wiring on the polished side of the semiconductor device.

Still another method to form the heterostructure may comprise the steps of:

1. Forming the active regions, including but not limited to the source and drain regions of field-effect transistors, in the silicon substrate prior to depositing a strain-controlling dielectric layer on the silicon substrate; 2. Depositing a strain-controlling dielectric layer on the silicon substrate over the active regions; 3. Etching contact holes in the deposited strain-controlling dielectric layer; 4. Forming the electrodes and wiring of the semiconductor device over the deposited strain-controlling dielectric layer.

In some embodiments, the strain-controlling dielectric layer acts as the hard mask during at least one step of the fabrication of the semiconductor device. In other embodiments, the strain-controlling dielectric layer is a stabilized amorphous carbon layer which is functionally graded and doped on the portion of its thickness with any metal or combination of metals, including but not limited to Cu, Ni, Cr, W, Mo, Ag, or Au. Some embodiments may insulate the doped conducting portion of thickness of the functionally graded stabilized amorphous carbon with an undoped dielectric and may also include a metallic heat sink bonded to the doped side of the strain-controlling layer of the functionally graded stabilized amorphous carbon.

In some embodiments, the heat sink is bonded to the strain-controlling dielectric layer.

In another aspect to the invention, a semiconductor device is fabricated with at least one insulating layer consisting of Stabilized Synergetic Carbon or at least one conducting layer consisting of Stabilized Synergetic Carbon doped with a metal or combination of metals, and the Stabilized Synergetic Carbon and/or doped Stabilized Synergetic Carbon acts as the etch stopping material. The conducting layer may also comprise Stabilized Synergetic Carbon doped with chromium or a combination of other metals with chromium, where the doped Stabilized Synergetic Carbon acts as a etch-stopping material in the chemical plasma etching treatment during fabrication.

In another embodiment of the present invention, a porous insulating layer consisting of Stabilized Synergetic Carbon is formed during the fabrication of a semiconductor device by introducing a removable "poro-forming" component during the material deposition, and then successfully removing the poro-forming components from the device. The introduction and removal of the poro-forming components may occur multiple times during the fabrication process from the deposited film. In addition, the process of introducing and removing the poro-forming components may be conducted in a continuous vacuum process. Alternatively, the process of removing the poro-forming components may be conducted outside the vacuum chamber in a separate process after the vacuum deposition process.

During the removing process, the surface temperature of the growing films may increase through IR irradiation or other techniques known from prior art. The removal process may include any of, individually or in combination: hydrogen, volatile organic molecules, and volatile metals, including but not limited to Zn. In some instances, the removal process may include any of, individually or in combination: Al, transition metals such as Cu, Fe, Ni, or other metals. An alternative embodiment may have the removable component be a portion of the carbon content of Stabilized Synergetic Carbon, where the portion of carbon content is oxidized by the incident oxygen flux during the removing process. Typically, if the porous insulating layer consists of Al, transition metals such as Cu, Fe, Ni, or other metals, the removal process may incorporate selective chemical or electro-chemical etching of the metallic components from the priory deposited doped Stabilized Synergetic Carbon.

In another embodiment of the invention, a semiconductor device may be fabricated with at least one nano-porous insulating layer consisting of Stabilized Synergetic Carbon. The nano-porous insulating layer is generally formed by deposition of doped Stabilized Synergetic Carbon material containing either nano-clusters of a removable component or a combination of components and then removing the nano-clusters components. In some implementations, the removable nano-cluster components are formed by a technique known from prior art and introduced in the incident flux during the deposition of the doped Stabilized Synergetic Carbon material. Other implementations may form nano-clusters of removable components by sputtering of the corresponding metal target maintained at an elevated temperature in the range of 0.3 Tm to 0.8 Tm, but preferably in the range of 0.35 Tm to 0.55 Tm, where Tm, K is the melting point of the corresponding metal. In yet other implementations, the removable nano-clusters components are formed by maintaining the substrate temperature at an elevated temperature in the range of 0.3 Tm to 0.8 Tm, but preferably in the range of 0.35 Tm to 0.55 Tm where Tm, K is the melting point of the corresponding metal. Another implementation may form removable nano-clusters components by thermal annealing of the priory deposited doped Stabilized Synergetic Carbon material.

In another embodiment of the invention, a semiconductor device may be fabricated with at least one Stabilized Synergetic Carbon low-k or ultra low-k porous dielectric layer and at least one Stabilized Synergetic Carbon barrier layer, where the adjacent porous low-k or ultra low-k dielectric layer and pore-free barrier layer may be fabricated by a variation of parameters in a continuous vacuum process. In addition, the pore-free barrier layer may provide a capping barrier, which is formed following the final step of the atomic-scale or nano-scale porous dielectric formation.

Also according to the present invention, a method for fabricating a semiconductor device is disclosed which comprises at least one layer of a low-k dielectric consisting of stabilized amorphous carbon and at least one medium-k dielectric barrier layer, where the barrier layer acts as water/vapor barrier. In another implementation, the barrier layer acts as a diffusion barrier, where the diffusion barrier prevents the atomic diffusion and ion electro-diffusion penetration of copper or other impurities into the low-k or ultra low-k dielectric or semiconductor. In yet another implementation, the barrier layer acts as a mechanical barrier by reinforcing the low-k or ultra low-k dielectric.

The semiconductor may comprise at least one layer of a low-k dielectric which comprises stabilized amorphous carbon, where at least one medium-k dielectric barrier layer underlies the low-k dielectric layer and at least one medium-k dielectric barrier layer overlays the low-k dielectric layer. The medium-k dielectric barrier comprises Stabilized Synergetic Carbon, where the SSC possesses a value of a dielectric constant in the range of from about 3 to about 6, and preferably in the range of 4 to 5.

The technique chemical-mechanical polishing (CMP) is extremely important in the contemporary technology, especially in damascene planarization, and precise control is warranted, but difficult. Radioactive material is used for this purpose in the prior art. The Stabilized Synergetic Carbon SSC is much harder than metals, silicon, and dielectrics used in this technology; hence, the SSC layers, such as barrier layers, may be used very effectively for such a control.

Therefore, in another aspect of the invention, a method for fabricating a semiconductor device is disclosed which comprises at least one insulating layer consisting of Stabilized Synergetic Carbon and at least one conducting layer consisting of Stabilized Synergetic Carbon doped with metal or combination of metals. The Stabilized Synergetic Carbon or doped Stabilized Synergetic Carbon acts as a chemical-mechanical polishing stopping material.

In yet another aspect of the invention, the insulating layer comprises at least one layer of stabilized amorphous carbon or doped stabilized amorphous carbon barrier layer. The barrier layer is adjacent to the conducting layer and the copper interconnect wiring. In this implementation, the barrier layer generally acts as a electromigration suppressing barrier by increasing resistance of the adjacent conducting layer.

In one embodiment, the copper interconnect wiring is encapsulated between an underlying barrier and an overlying barrier consisting of conducting doped Stabilized Synergetic Carbon. The conducting barrier coating generally prevents copper diffusion in a dielectric or a semiconductor. In addition, the conducting barrier coating typically provides the copper wiring with resistance against electromigration, for instance, resistance against the mass transport of metal due to a momentum transfer between conducting electrons and diffusing metal atoms. Additionally, the conducting barrier may improve the planarization process. Typically, the conducting barrier film consists of Stabilized Synergetic Carbon doped with metallic elements, such as copper, and/or tungsten, chromium, molybdenum, or other hard melting transition metals, either individually or in combination. The encapsulated interconnect wiring may be formed in a one-step continuous vacuum process including vacuum deposition of the barrier under-layer, the copper conductor layer, and the top barrier layer. In another embodiment, the encapsulated interconnect wiring comprises functionally graded barriers where the functionally graded barriers are formed by the gradual transition from the underlying barrier to a copper conductor layer or the gradual transition from the copper conductor layer to the overlaying barrier layer or both.

In a preferred embodiment of the copper interconnection wiring encapsulated in a SSC conducting barrier coating, the copper interconnection wiring is formed in a one-step continuous vacuum process. In this process, the vacuum deposition of the barrier under-layer, copper conductor layer, and top barrier layer is done together. In another embodiment, the encapsulated interconnect wiring comprises functionally graded barriers where the functionally graded barriers are formed by the gradual transition from the underlying barrier to a copper conductor layer or the gradual transition from the copper conductor layer to the overlaying barrier layer or both.

One method of fabricating a semiconductor device with an encapsulated copper interconnect wiring is coating is coating the copper interconnect wiring with the overlaying dielectric barrier along the in-plane edges with thin film Stabilized Synergetic Carbon dielectric. The thickness of each of the encapsulating barriers should not exceed 100 mn, and preferably does not exceed 10 nm. The dielectrically encapsulated interconnection copper wiring may be fabricated upon semiconductors in a multistage process. In general, fabricating an encapsulated dielectric metallic interconnect wiring requires a multi-step deposition to form vias connecting the wiring of different levels. For instance, the first step would provide the underlying dielectric and a portion of the wiring thickness. The following step would form the interlevel contact holes. Then the following deposition step may simultaneously provide contacts (vias) and the remaining portion of thickness of the conducting lines. Finally, the capping dielectric barrier will be formed. One embodiment of a fabrication process follows:

1. A first continuous deposition process of:
   1.1. Depositing an SSC dielectric under-layer; where the thickness of the under-layer should not exceed 100 mn, but preferably does not exceed 10 nm.
   1.2. Depositing a complimentary (but not necessary) interface/barrier conducting film. The interface/barrier conducting film includes a silica stabilized amorphous carbon that is doped with copper or other hard-melting transition metals, either individually or in combination. In addition, the interface/barrier conducting film may include pure hard-melting transition metals such as Cr, W, Mo, or an amorphous intermetallic compound, such as carbide, amorphous tungsten carbide, or silicides of hard-melting transition metal. Typically, the thickness of the interface/barrier film does not exceed 100 nm, and preferably does not exceed 10 nm.
   1.3. Depositing a copper conductor film comprising a part X of the required thickness d of the copper interconnection line; preferably where $X \leq 0.5d$.
   1.4. Depositing a complimentary (but not necessary) second interface/barrier conducting film as described above in step 1.2.
2. Etching the hole to the transistor electrodes, and other active regions of the semiconductor devices for interlayer connections. The hole is created using a common technique known from the prior art.
3. A second continuous deposition process consisting of:
   3.1. Depositing a complimentary (but not necessary) third conducting interface/barrier film as described in step 1.2 above.
   3.2. Depositing a copper conductor film comprising the remaining part (d-X) of the required thickness of the copper interconnection line.
   3.3. Depositing a complimentary (but not necessary) fourth interface/barrier conducting film as described in step 1.4 above.
   3.4. Depositing the SSC dielectric capping overlying barrier film as described above in step 1.1 with regard to the underlying dielectric barrier film.

A still further embodiment of the present invention provides a method for fabricating a semiconductor device comprising forming at least one insulating layer of Stabilized Synergetic Carbon, and/or at least one conducting layer of Stabilized Synergetic Carbon doped with metal or combination of metals. At least one of the level of the copper interconnection wiring has a partial air gap interlevel and/or intralevel insulation. In yet another embodiment, the partial air gap insulation is fabricated using a generally known prior art technique of removable, or sacrificial material as a temporal inter-layer spacer feasible for damascene technology. This removable spacer material may be a silicon oxide or metals, individually or in combination. Metals may be aluminum, copper or other metals, individually or in combination. The removable spacer material is selectively etched off after the wiring formation is completed and the SSC dielectric and/or the conducting barrier films act as an etching stopping barrier.

Figure 8:
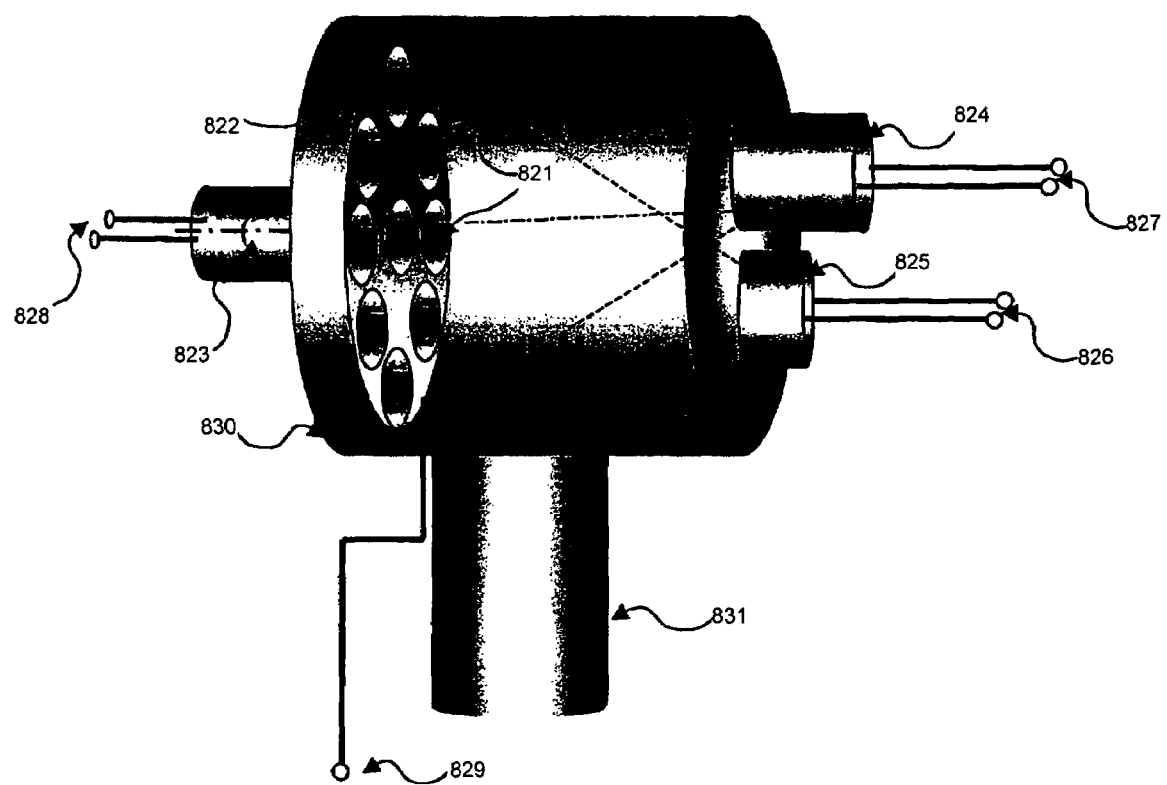
FIG. 8 illustrates a schematic view of vacuum deposition system for the fabrication of a Stabilized Synergetic Carbon dielectric and doped Stabilized Synergetic Carbon conducting barriers.

FIG. 8 is a schematic view of a vacuum deposition system for the fabricating of Stabilized Synergetic Carbon dielectric and doped Stabilized Synergetic Carbon conducting barriers. Substrates 801 are placed within a planetary rotating substrate holder 802 which is attached to a substrate holder drive 803 within a vacuum chamber 811 within a vacuum pump 811. A plasmatron 804 is connected to magnetrons 805 both of which are connected to the vacuum pump 811. Power supplies 806, 807, and 808 provide power and a high-voltage power supply 809 provide the power for the plasmatron 804 and magnetrons 805.

Figure 9:
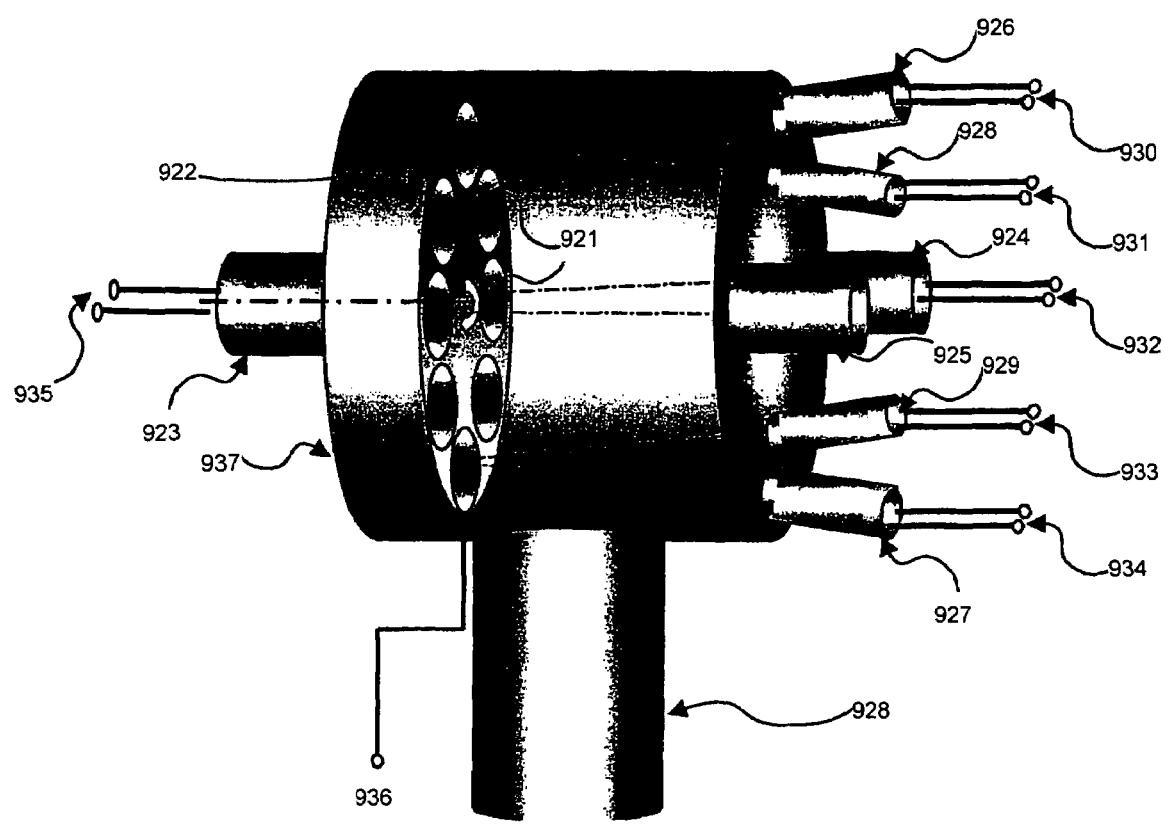
FIG. 9 illustrates a schematic view of vacuum deposition system for the fabrication of Stabilized Synergetic Carbon, such as ultra low-k Stabilized Synergetic Carbon dielectric in a continuous vacuum process.

FIG. 9 is a schematic view of a vacuum deposition system for the fabricating of Stabilized Synergetic Carbon, including ultra low-k Stabilized Synergetic Carbon dielectric in a continuous vacuum process. Substrates 901 are placed within a planetary rotating substrate holder 902, which is within a vacuum chamber 917 attached to a diffusion vacuum pump 918. Connections from a high-voltage power supply 916 and from various other power supplies 910, 911, 912, 913, 914 and 915 supply power for the plasmatrons 904 and 905, magnetrons 906 and 907 and pulse radiation heaters 909 and 910, which are housed within the vacuum chamber 917 attached to the diffusion vacuum pump 918.

While the specifics of the chamber diameter and specific geometry is not essential for the present invention, all examples referred to in this description are produced in a cylindrical chambers with an inside diameter from about 750 mm to about 1000 mm.

In one embodiment of the invention, for deposition within the vacuum chambers, the chambers combine both the plasma source for the deposition of SSC films and the doping element source or sources, preferably planar magnetron/magnetrons. These chambers will allow the depositing of all kinds of films, including but not limited to, undoped dielectric SSC films, SSC films doped with various elements (such as metallic elements), functionally graded films, multiplayer structures comprising medium-k, low-k or ultra low-k dielectric layers, doped conducting barrier layers, etc.

Typically, SSC films are deposited from the flux of carbon-containing radicals and are the preferred embodiment of the present invention. However, different embodiments of SSC deposition process are possible and well known in the art, such as, co-deposition from multiple atomic or molecular fluxes, which contain individual elements or low-molecular constituting elements of SSC.

In one embodiment, the radical beam generated by a multi-cascade remote plasmatron 824, 924, and 925 uses a high boiling point silicon-organic precursor $(CH_3)$ 3SiO $[CH_3C_6H_5SiO]$ 3Si $(CH_3)$ polymethyl-phenyldisiloxane (M=571.05, LgP=15.0-5700T-1, Pa). This precursor is optimum for stabilized diamond-like carbon synthesis due to its physical-chemical properties, an optimum C/(Si+O) ratio, and a relatively low hydrogen content. The general chemical composition of silica-stabilized diamond-like carbon films grown from polymethyl-phenyldisiloxane is: Cn [Sil -m Om], where typically n=3, m=0.45, and sp2: sp3 is in the range from about 2:3 to about 1:4, depending upon growth conditions. The silicon-organic liquid is generally supplied through a microporous ceramic head located in the geometric center of the plasma discharge. The remote plasma discharge can be generated using a W-Th hot filament and crossing two electrical fields, that is, a low voltage D.C. (radial) and a high voltage rf or DC (axial). While the low voltage (typically around ~100V) D.C. field is generally located in the internal plasmatron space, the high voltage bias field crosses the entire chamber space. The filament temperature is in the range of about 2900+100 K, while the estimated ratio of electron emission to the precursor vapor flow is approximately 102 electron/molecule. During the deposition process, the substrates are located on the planetary rotating substrate holder 822. According to one embodiment of the present invention, it is especially effective to use the electrical-magnetic high-speed drive as a substrate holder 922 in order to provide the most uniform atomic-scale or nano-scale pore distribution. In another embodiment of the invention, deposition chambers with double-rotating planetary substrate holders may be useful to provide film uniformity.

In one embodiment, chambers used for the deposition process possess an internal diameter of 1000 mm, with a 950-mm double-rotating planetary substrate holder, a central plasmatron with an inside diameter of 250 mm, three peripheral plasmatrons with inside diameters of 160 mm, and three planar magnetrons with inside diameters of 160 mm. The peripheral plasmatrons and planar magnetrons are located concentrically with regard to the central plasmatron.

For the purposes of simplicity, the following are based on typical conditions for a deposition process: a 750-mm diameter chamber with a double-rotating planetary substrate holder, one plasmatron with an inside diameter of 160 mm, and one planar magnetron with an inside diameter of 160 mm.

The following are examples of typical conditions for the deposition of doped and undoped SSC films in a 750-mm diameter chamber:

For the plasmatron, the cathode current is in the range from about 60 to about 70 A, while 65 A is typical. The plasma current is in the range from about 3 to about 7 A, while 5 A is typical. The distance from the cathode to the substrate is in the range from about 10 to about 30 cm, while 24 cm is typical.

mately 150 GPa or greater, and hardness of approximately 15 GPa or higher, the accelerating voltage precursor is generally in the range from about 500 V to about 2000 V, while the range from about 700 to about 1200 V is most preferable. The preferable substrate temperature range is approximately 350K or lower.

The pressure in the chamber prior to the deposition process should be about $1.3 \times 10^{-2}$ Pa. During the deposition process, the pressure in the chamber should be about $5 \times 10^{-2}$ Pa.

For the plasmatron, the cathode current is in the range from about 60 to about 70 A, while 65 A is typical. The plasma current is in the range from about 3 to about 7 A, while 5 A is typical. The distance from the cathode to the substrate is in the range from about 10 to about 30 cm, while 24 cm is typical.

The initial flow rate of the liquid precursor is in the range from about 2 to about 6 ml per hour, while 3 ml per hour is a typical value.

The accelerating (bias) voltage precursor is about 100 V; 1.76 MHz.

For the Magnetron, typically a current of 1.2 A is used for deposition of metal-SSC films containing 50% of metal. Different current levels either below or exceeding the above indicated value may be used for depending upon other specific requirements.

Typical voltages for the Magnetron is shown in the table below for different metals.

| Metal | W | TA | Nb, Hf | Zr, CR | Ti | Ni | Cu | Al | Zn |
|---|---|---|---|---|---|---|---|---|---|
| Voltage Typical, V | 850 | 750 | 700 | 650 | 600 | 550 | 500 | 450 | 400 |
| Voltage Entire preferable range, V | 660-1000 | 600-900 | 560-860 | 500-830 | 500-800 | 450-800 | 400-700 | 350-650 | 350-550 |

The initial flow rate of the liquid precursor is in the range from about 2 to about 6 ml per hour, while 3 ml per hour is a typical value. Deposition rates of 3.6 micrometers per hour (1 nm per second) are typical values for the above indicated parameters. While an initial flow rate of liquid precursor in the range of 6 to 10 ml per hour or higher may be applied, it may be not preferable for depositing thin dielectric layers.

The accelerating (bias) voltage precursor is generally in the range from about 10 V to about 2000 V; 1.76 MHz, while the following more specific ranges and values are preferable for specific required materials.

For pore-free dielectrics possessing k-values in the range from about 3 to about 5, elastic modulus of approximately 150 GPa or greater, and hardness of approximately 15 GPa or greater, the accelerating voltage precursor is generally in the range from about 80 V to about 1000 V, while the range from about 100 to about 200 V is most preferable. The preferable substrate temperature range is from about 350 K to about 600 K, while the temperature range from about 400 K to about 500 K is the most preferable.

For pore-free dielectric possessing k-value in the range of approximately 6 to 7 or higher, elastic modulus of approxi- The following are examples of typical conditions for the deposition of SSC films in a 160-mm diameter chamber:

Deposition rates of 5 micrometers per hour are typical values for this size chamber.

The pressure in the chamber prior to the deposition process should be about $1.3 \times 10^{-2}$ Pa. During the deposition process, the pressure in the chamber should be about 0.11 Pa.

These characteristics of the deposition process are provided as examples only and are not intended to limit the invention.

Although the most preferred precursor for most embodiments of the present invention is $(CH_3)$ 3SiO $[CH_3C_6H_5SiO]$ 3Si $(CH_3)$ polymethyl-phenyldisiloxane (M=5 71.05, LgP=15.0 5700T-1, Pa), other precursors may be used as well, such as cyclotetrasiloxane $C_{28}H_{32}O_4Si_4$, MFT-1 $(CH_3C_6H_5SiO)4$ and a broad variety of other silicon-organic liquids. Furthermore, for specific embodiments, one or more precursors may be selected from the following group of silicon-organic compounds:

| Name | Formula |
|---|---|
| Propanol 3-trymethylsilyl | $C_6H_{16}OSi$ |
| Silacyclohexane | $C_{17}H_{20}Si$ |
| Diethyldiethoxysilane | $C_6H_{16}O_2Si$ |
| Diphenyldiethoxysilane | $C_6H_{20}O_2Si$ |
| Diethoxymethyiphenylsilane | $C_{11}H_{18}O_2Si$ |
| Allydiethoxymethylsilane | $C_6H_{18}O_2Si$ |
| Diemethoxydimethylsilane | $C_4H_{12}O_2Si$ |
| Diemethoxydiphenylsilane | $C_{14}H_{18}O_2Si$ |
| Diphenoxydimethylsilane | $C_{14}H_{18}O_2Si$ |
| Ethenyldiethoxymethylsilane | $C_7H_{16}O_2Si$ |
| Ethenylethoxydimethylsilane | $C_6H_{14}OSi$ |
| Ethenyltriethoxysilane | $C_8H_{18}O_3Si$ |
| Ethoxytriethylsilane | $C_8H_{20}OSi$ |
| Ethoxytrimethylsilane | $C_5H_{14}OSi$ |
| Ethoxytriphenylsilane | $C_{20}H_{20}OSi$ |
| Ethyltrimethoxysilane | $C_5H_{14}O_3Si$ |
| Methyltriphenoxysilane | $C_{19}H_{18}O_3Si$ |
| 1,3-phenylenebis(oxy)bistrimethylsilane | $C_{12}H_{22}O_2Si_2$ |
| Phenytripropylsilane | $C_{15}H_{26}Si$ |
| Tetravinylsilane | $C_8H_{12}Si_2$ |
| Tetraethylsilane | $C_6H_{20}Si$ |
| Tetramethylsilane | $C_4H_{12}Si$ |
| Tetraphenylsilane | $C_{24}H_{20}Si$ |
| Tributylsilane | $C_{12}H_{28}Si$ |
| Tributyiphenylsilane | $C_{18}H_{32}Si$ |
| Triethoxysilane | $C_6H_{16}O_3Si$ |
| Triethoxy.ethylsilane | $C_8H_{20}O_381$ |
| Triethoxymethylsilane | $C_7H_{18}O_3Si$ |
| Triethoxypenthylsilane | $C_{11}H_{26}O_3Si$ |
| Triethoxyphenylsilane | $C_{12}H_{20}O_381$ |
| Triethoxy-2-propenylsilane | $C_9H_{20}O_3Si$ |
| Triethylsilane | $C_6H_{16}Si$ |
| Triethyifluorosilane | $C_6H_{15}FSi$ |
| Triethyiphenylsilane | $C_{12}H_{20}Si$ |
| Trifluorophenylsilane | $C_6H_5F_35i$ |
| Trimethoxymethylsilane | $C_4H_{12}O_3Si$ |
| Trimethoxyphenylsilane | $C_9H_{14}O_3Si$ |
| Trimethylsilane | $C_3H_{10}Si$ |
| Trimethyl-4-methylphenylsilane. | $C_{10}H_{16}Si$ |
| Trimethyl-2-methypropylsilane | $C_7H_{18}Si$ |
| Trimethiphenoxylsilane | $C_9H_{14}OSi$ |
| Trimethyiphenylsilane | $C_9H_{14}Si$ |
| Trimethylphenylmetthylsilane | $C_{10}H_{16}Si$ |
| Trimethyl-2-propenylsilane | $C_6H_{14}Si$ |
| Trimethyipropylsilane | $C_6H_{16}Si$ |
| Trimethyl-4-trimethylsilyloxyphenylsilane | $C_{12}H_{22}OSi_2$ |
| Silanetriol, ethenyl, triacetate | $C_8H_{12}O_6Si$ |
| Silanetriol, methyl, triacetate | $C_7H_{12}O_6Si$ |
| Tripropylsilane | $C_9H_{22}Si$ |
| Dimethyl ethyl silanol | $C_4H_{12}OSi$ |
| Methyldiphenyl silanol | $Cl_3H_{14}OSi$ |
| Triethylsilanol | $C_6H_{16}OSi$ |
| Triephenylsilanol | $C_{18}H_{16}OSi$ |

While this list is provided as a general preferred precursors according to the present invention, it is not intended to limit the invention to the particular precursor materials described.

The doping metallic elements may be applied to the Stabilized Synergetic Carbon layer during its formation in a co-deposition process combining flux containing carbon and stabilizing elements and flux containing doping elements. The doping element may be introduced as oxides of the metallic elements, which is a preferred embodiment for this method. The flux containing oxides of doping elements is preferably formed using high-frequency magnetron sputtering, already known in the art. In such an embodiment, the planar magnetrons 805, 906, 907 as shown in FIGS. 8 and 9 are used with a R.F. power supply. Typically, the metal-organic compound precursors are used to form the flux containing metal-oxygen low-molecular species. The oxidizing process for obtaining doping elements may be conducted by any prior art technique either in the continuous vacuum process or outside of the vacuum chamber.

The applicable oxidizing techniques is generally known from the prior art and includes, but is not limited by, the following process:

1. Depositing doped SSC under the pressure of oxygen in the range of 0.1 to 0.001 Pa.
2. Depositing doped SSC while bombarding the surface of the growing doped SSC film with a flux of oxygen ions.
3. Alternating doped SSC film deposition cycles with the exposure of the previously deposited film to either oxygen, ozone, or some other oxidizing gas under pressure in the range of 1 Pa to 0.00 1 Pa. During the oxidizing exposure, substrates are heated up to elevated temperatures typically in the range from about 500 K to about 1000 K.

Another embodiment of the present invention is having the doped high-k dielectric functionally graded and containing an undoped barrier, thereby preventing undesired electrical phenomena on both the interface of the doped dielectric and the active region of the silicon device.

In one aspect of the invention, a strain-controlling dielectric SSC layer is deposited on the silicon wafer. The substrate, preferably a heat sink substrate, is bonded to the strain-controlling dielectric SSC layer. The silicon wafer is removed by a CMP or anisotropic etching process and the removing process is stopped when the required thickness for the strained silicon is reached. The structure of the semiconductor device is completed by prior art techniques.

In another aspect of the invention, a silicon-on-insulator (SOI) structure comprising thin active silicon regions without strain is formed by prior art techniques. A strain-controlling dielectric SSC layer is deposited on the previously formed thin SOI. The electrode holes are then etched off from the strain-controlling dielectric SSC layer.

Neither method of strained silicon fabrication increases the cost of semiconductor device fabrication. In addition, the strain-controlling material may be an insulator. Problems such as SiGe thermal instability and silicon contamination by germanium are avoided. At least one enhancement using this process is that current leak is decreased. Additionally, since the SSC coatings typically comprise an underlying coating and a capping coating wherein each coating is deposited from a side of the silicon wafer, the two-sided SSC coatings produce a pre-defined equal stress from both sides of the active silicon regions.

The first embodiment is typically the most preferred because it generally provides a self-conformal fabrication of the strained silicon-on-insulator (SS-SOI) structure and simplifies the requirements for the thickness of the strain-controlling layer.

In accordance with the present invention, both Stabilized Synergetic Carbon materials and QUASAM™ are used as etch stopping materials. The following example is provided below for illustration purposes only. A 300-micrometers thick QUASAM™ material is deposited upon a 600-micrometers thick silicon wafer after the silicon wafer had been polished by a CMP technique in accordance with the electronic industry standard. The Silicon wafer was then completely etched off by a well known technique using a HF-HNO(sup.3) acid agent.

A systematic set of the freed interface surfaces of the QUASAM™ plates was then examined by an Atomic-Force Microscopy. It was found that the nano-roughness of the freed interfaces of QUASAM™ corresponds well to the initial roughness of the removed silicon substrates.

It is important for the present invention in fabricating integrated circuits that undoped dielectric SSC and metal-doped conducting SSC-based materials can be etched. More specifically, the undoped dielectric SSC, especially QUA-SAM™, are resistant against strong acids like HCl, HNO$_3$, HF, H$_2$SO$_4$ at temperature ranges of at least up to 200 degree Celsius. The undoped dielectric SSC may be etched by fluorine-containing plasma, a prior art method known in the industry. Some selected metal-doped dielectric SSC conducting Me-SSC, in particular W-SSC and Mo-SSC may also be etched in standard conditions by fluorine-containing plasma.

However, selected metal-doped dielectric SSC conducting Me-SSC, especially Cr-SSC cannot be etched by any known liquid chemical or chemical plasma technique. The Cr-SSC acts as an etch-stopping material for both liquid chemical and chemical plasma etching technique. However, Cr-SSC may be etched through ion bombardment by using either a photo-resist or a hard mask.

Also in accordance with the present invention, the porous Stabilized Synergetic Carbon materials are employed as low-k and ultra low-k dielectrics.

In accordance with the present invention there are two families of porous Stabilized Synergetic Carbon materials, atomic-scale porous SSC and nano-porous SSC. The density of dielectric SSC atomic-scale pores is in the range from about 1.0 to about 1.9. The dielectric constant is in the range from about 2.0 to about 3.4. The most preferable range for the elastic modulus values of a porous low-k dielectric SSC atomic-scale is from about 150 GPa to about 10 GPa.

In another embodiment of the invention, Stabilized Synergetic Carbon materials comprising nano-scale pores are used as ultra low-k dielectric. In accordance with the present invention, the ultra low-k dielectrics SSC having nano-scale pores are formed in two major steps:

1). Depositing SSC material containing nano-clusters with removable components or a combination of components.

2). Removing the nano-clusters with the removable components from the SSC.

Clusters are removed from the cluster-containing film by one of the techniques described above for atomic-scale pore formation. Nano-pores produced outside the vacuum chamber in a separate process after the vacuum deposition process is complete are also described above. In an embodiment of the invention, the nano-pores are produced by alternating the deposition regime while maintaining a continuous vacuum process as described above. In this embodiment, the periods for depositing the SSC material containing removable components alternate with periods for removing those components from the previously deposited film.

However, there is a difference from the above described disclosure for the atomic-scale pore formation. The nano-cluster removing process does not imply a strong thickness limitation for the one-step removing process.

The ultra low-k porous dielectric preferably contains pores with a mean size not exceeding about 5 nm, preferably not exceeding 1 nm, and more preferably not exceeding 0.5 nm. The density of ultra low-k nano-porous dielectric is in the range of about 0.6 to about 1.6. The dielectric constant value is below about 2.5, and preferably below 2.0. The typical range for the elastic modules values in nano-porous ultra low-k dielectric Stabilized Synergetic Carbon is from about 10 GPa to about 0.5 GPa.

Furthermore, the present invention provides two major embodiments for formation of the atomic-scale pores. Both embodiments imply introducing the removable "poro-forming" components during the material deposition, and then successfully removing the poro-forming components.

In one of the these embodiments, the atomic-scale pores are produced by alternating the deposition regime while maintaining a continuous vacuum process during the deposition regime. In this embodiment, the periods of deposition of the SSC containing removable components alternate with periods of removing those components from the previously deposited film. The removable components may include any one of the following, either individually or in combination; hydrogen, volatile organic molecules, or volatile metals, such as Zn. During removing periods, the surface temperature of the growing films are increased, preferably through high power irradiation. More specifically, the surface temperature and the time duration of the removing period is determined by the specific "poro-forming" components. Typically the surface temperature is in the range of about 300 degree C. to about 800 degree C., while the time duration varies from about 10 minutes to about 10 seconds or less.

In still another embodiment, a portion of the carbon content of SSC is used as the removable component. In this embodiment, the incident oxygen flux is used to oxidize and remove the corresponding portion of the carbon content. The temporal temperature increase and the energizing of the incident oxygen flux by known prior art techniques is used to overcome the activation energy barrier for oxygen-carbon surface reactions. One example may use a high intensity infrared pulse irradiation to heat the components.

In another embodiment, atomic-scale pores are produced outside the vacuum chamber in a separate process after the vacuum deposition process has completed. In this embodiment, metals are used as the removable "poro-forming" component. The metals might be transition metals such as Cu, Fe, Ni, or simply a metal such as Al. The pores are produced by either selective chemical or by selective electro-chemical etching of the metal component from the deposited SSC, typically in a liquid solution. Chemical or electrochemical baths suitable for such selective removing of the metallic "poro-forming" components are known from prior art for these metals.

The Stabilized Synergetic Carbon contains a certain percentage of weakly bonded hydrogen, depending on the deposition temperature and accelerating/bias voltage. At a bias voltage in the range from about −50V to about 200V and a substrate temperature during the deposition of about 300 K, the hydrogen content is in the range of about 100% to about 60%, respectively, relative to the carbon content. Over 50% of this hydrogen content may be extracted from the deposited film by post-growth annealing.

At a bias voltage in the range of about 200 V or higher and a substrate temperature during the deposition of about 600 K, the hydrogen content is about or below 10% relative to the carbon content. This strongly bonded hydrogen is highly resistant to post-deposition annealing. Therefore, if the barrier layers are grown at a relatively high deposition temperature, the deposition process produces barrier films possessing especially high thermal stability.

Alternatively, when a low-temperature/low voltage deposition regime is applied while fabricating films, it is possible to subject the barrier layer to a post-deposition extraction of extra hydrogen and formation of atomic-scale or nano-porous ultra low-k dielectrics.

To determine the specific regime for post-deposition annealing, the hydrogen emission was investigated by a differential thermal analysis in a vacuum (0.1 Pa). The differential thermal analysis indicates that the optimum temperature range for post-deposition annealing depends on deposition temperature and accelerating voltage. More specifically, where films were deposited at a bias voltage in the range of about 50V to about 100V and a substrate temperature during the deposition of about 300 K, the emission of hydrogen begins about approximately 200° C. and finishes at about ~250° C. Therefore this type of vacuum thermal training produces a predominantly atomic-scale porous ultra low-k dielectric while simultaneously stabilizing its structure. This type of pore-forming annealing is preferably conducted after the deposition process in the same or an adjacent vacuum chamber.

Typically, in both embodiments of the atomic-scale pore formation it is preferable that the thickness of the layer subjected to each one-step removing process does not exceed 10 nm, and preferably does not exceed ~3 nm. Hence, formation of a thick layer comprising atomic-scale pores requires a few removing steps. Consequently, the alternating deposition regime maintaining continuous vacuum process is preferred for a thick atomic-scale porous layer formation.

One example of the above embodiment is as follows:
1. The 5-nm thick undoped SSC barrier is deposited as described above during a 10-second deposition process. The medium-k dielectric barrier possesses hardness of about 20(+/−3) GPa, an elastic modulus of about 200 (+/−20) GPa, and a dielectric constant of about 3.4.
2. The ~5-nm thick Zn-doped SSC, or more specifically, a Zn-SSC film containing ~50% of zinc by volume, is deposited as described above during a 4-second deposition process.
3. The plasmatron and magnetron are switched off.
4. The substrates are exposed to irradiation of an additional 50-kW hot cathode during 4 seconds, and the 5-nm thick dielectric with an effective k-value of about 1.8 is formed. As a result of the high-temperature exposure, Zn is evaporated from the ZnSSC film having been deposited during step 2 above. Evaporation of zinc promotes a partial release of carbon and hydrogen and therefore the total volume of the porosity in the resulting structure exceeds the initial partial volume occupied by Zn. In addition, the total volume of porosity is approximately 60%. Therefore a predominantly atomic-scale porous (where the pore size does not exceed ~0.5 nm) and partially nano-porous (where the pore size does not exceed ~1.5 nm) 5-nm thick ultra low-k dielectric structure is formed. The effective k-value of this porous dielectric is in the range of about 1.95 to about 2.0, and the elastic modulus is about 20 GPa.
5. The 50-kW hot cathode is switched off.
6. After a 1-minute interval, the plasmatron and magnetron are switched back on.
7. A cycle comprising steps 2-6 are repeated 30 times. The 150-nm thick ultra low-k dielectric structure is formed.
8. Step 1 is repeated, and a capping 5-nm thick medium-k dielectric barrier is formed, as described in step 1 above. A 160-nm thick ultra low-k dielectric structure is formed which has 5-nm thick underlying and capping medium-k hard barriers, a 190-nm thick porous ultra low-k dielectric layer, and an effective k-value wherein the entire functionally of the graded structure is about 2.0.
9. The chamber is cooled off and opened.

EXAMPLE 2

In this example, a 200-nm thick ultra low-k dielectric comprising a 190-mn thick nano-porous layer is formed. The resulting porous dielectric layer contains a porosity with a relative volume of ~70%. This ultra low-k dielectric possesses a k-value with less than 2.0.
1. The 5-nm thick undoped SSC barrier is deposited as described above during a 10-second deposition process. The medium-k dielectric barrier possesses hardness of about 20(+/−3) GPa, an elastic modulus of about 200 (+/−20) GPa, and a dielectric constant of about 3.4.
2. The ~5-nm thick Zn-doped SSC, or more specifically, a Zn-SSC film containing ~67% of zinc by volume, is deposited as described above using the magnetron at a current of 1.5 A during a 4-second deposition process.
3. The plasmatron and magnetron are switched off.
4. The substrates are exposed to irradiation of an additional 50-kW hot cathode during 4 seconds, and the 5-nm thick dielectric with an effective k-value of about 1.8 is formed. As a result of the high-temperature exposure, Zn is evaporated from the ZnSSC film having been deposited during step 2 above. Evaporation of zinc promotes a partial release of carbon and hydrogen and therefore the total volume of the porosity in the resulting structure exceeds the initial partial volume occupied by Zn. In addition, the total volume of porosity is approximately 72%. Therefore a predominantly nano-porous (where the pore size does not exceed ~2 nm) 5-nm thick ultra low-k dielectric structure is formed. The effective k-value of this porous dielectric is in the range of about 1.65 to about 1.7, and the elastic modulus is about 5 GPa.
5. The 50-kW hot cathode is switched off.
6. After a 1-minute interval, the plasmatron and magnetron are switched back on.
7. A cycle comprising steps 2-6 are repeated 38 times. The 190-nm thick ultra low-k dielectric structure is formed.
8. Step 1 is repeated, and a capping 5-nm thick medium-k dielectric barrier is formed, as described in step 1 above. A 200-nm thick ultra low-k dielectric structure is formed which has 5-nm thick underlying and capping medium-k hard barriers, a 190-nm thick porous ultra low-k dielectric layer, and an effective k-value wherein the entire functionally of the graded structure is about 1.8.
9. The chamber is cooled off and opened.

EXAMPLE 3

In this example, the 200-nm thick ultra low-k dielectric comprising a 190-nm thick nano-porous major layer is formed. The resulting porous dielectric layer contains a porosity with a relative volume ~77%. This ultra low-k dielectric possesses a k-value less than 1.8.
1. The 5-nm thick undoped SSC barrier is deposited as described above during a 10-second deposition process. The medium-k dielectric barrier possesses hardness of about 20(+/−3) GPa, an elastic modulus of about 200 (+/−20) GPa, and a dielectric constant of about 3.4.
2. The ~150-nm thick Zn-doped SSC, or more specifically, a Zn-SSC film containing ~72% of zinc by volume, is deposited as described above using the magnetron at a current of 1.7 A during a 120-second deposition process.
3. The plasmatron and magnetron are switched off.

4. The substrate holder heater (not shown on FIG. 8) is switched on, and the substrate temperature is increased up to about 725 K.
5. The substrate is exposed at a temperature of about 725 K in vacuum for approximately 1 hour.
6. The substrate holder heater is switched off
7. The substrates are held in vacuum for approximately 15 minutes and then cooled up to about to 500K. As a result of the 1-hour long high-temperature exposure, Zn is evaporated from the ZnSSC film having been deposited during step 2 above. Evaporation of zinc promotes a partial release of carbon and hydrogen and therefore the total volume of the porosity in the resulting structure exceeds the initial partial volume occupied by Zn. In addition, the total volume of porosity is approximately 77%. Therefore, a predominantly nano-porous (where the pore size does not exceed ~2 nm) 5-nm thick ultra low-k dielectric structure is formed. The effective k-value of this porous dielectric is in the range of about 1.55 and the elastic modulus is about 2 GPa.
8. Step 1 is repeated, and a capping 5-nm thick medium-k dielectric barrier is formed, as described in step 1 above. A 200-nm thick ultra low-k dielectric structure is formed which has 5-nm thick underlying and capping medium-k hard barriers, and an effective k-value wherein the entire functionally of the graded structure is about 1.66.
9. The chamber is cooled off and opened.

In accordance with the present invention, deposition of SSC material containing nano-clusters may be realized in a number of different embodiments. In one embodiment, the incident flux of the poro-forming materials, such as a removable metal, contains clusters of the required sizes. More specifically, the sizes of clusters in the incident flux are defined by a feasible distribution function. Such a flux may be formed by a variety of prior art techniques. In another embodiment, the substrate temperature is maintained in an approximately similar range during the deposition process and clusters are formed as the result of a surface diffusion process during the material deposition. Also, in accordance with the present invention, the cluster containing flux may be formed by sputtering of the corresponding metal target maintained at an elevated temperature, typically in the range of about 0.35 Tm to about 0.6 Tm, where Tm, K is the melting point of the corresponding metal. For example, if Cu is employed (Tm=1357 K) as the poro-forming material, the above defined temperature range would be from about 200 degree C. to about 550 degree C. For this embodiment, the triode scheme of the sputtering assembly is more preferable than the planar magnetron. In yet another embodiment, an atomic-scale pores SSC layer is formed first, as described above, and the following thermal annealing is employed for the nano-cluster formation. Typically, the required annealing time for melting point temperatures are in the range of about T=0.4 Tm to about T=0.5, where Tm is in the range of about 5 minutes to 2 hours, depending on cluster size. Prior art indicates that the distribution function of the cluster-containing film may be monitored by a nonlinear optical response, and more specifically, by a Second Harmonic Generation under a high-intensity laser irradiation.

In accordance with the present invention, the porous ultra low-k dielectric SSC may be encapsulated in the pore-free low-k or medium-k dielectric SSC barrier. The encapsulating barrier prevents water penetration and metal ion migration into the porous ultra low-k dielectric SSC. Typically the barrier layer also reinforces the porous ultra low-k dielectric SSC providing it with surface properties feasible for all the required steps of planarized multi-level interconnection system formation. These steps include, but are not limited to, various deposition processes at elevated temperatures, chemical etching, damascene planarization, or short annealing required for doping impurities activation in silicon.

The pore-free low-k or medium-k dielectric SSC barrier has a dielectric constant that generally does not exceed 5, an elastic modulus of at least 50 GPa, a hardness of at least 7 GPa. Preferably, the low-k or medium-k dielectric SSC possesses an elastic modulus above 100 GPa and a hardness above 15 GPa. Additionally, the thickness of the thin medium-k dielectric film should not exceed 10% of the thickness of the low-k dielectric, but preferably does not exceed 5% of the thickness of the low-k dielectric.

Typically, a high-k dielectric is produced at a deposition temperature of below about 100 degree C., but preferably not exceeding 30 degree C. The accelerating (bias) voltage energizing the incident carbon containing flux is generally in the range from about 200V to about 5,000V, but preferably in the range of about 800V to about 1500V. The medium-k dielectric is typically produced at a deposition temperature of below about 300 degree C., but preferably not exceeding 150 degree C. The accelerating (bias) voltage energizing the incident carbon containing flux is in the range from about 100V to about 1500V, but preferably in the range from about 100V to about 500V. The low-k dielectric is typically produced at a deposition temperature of below about 300 degree C., but preferably not exceeding 200 degree C. The accelerating (bias) voltage energizing the incident carbon containing flux is in the range from about 10V to about 150V, but preferably in the range from about 20V to about 100V. This adjustable inexpensive process provides either the low-k or ultra low-k dielectrics with properties such as surface reinforcement, densification, and an inherent copper ion migration barrier. Additionally, this process can be realized in the same chamber for high-k gate dielectrics, medium-k dielectric barriers, low-k dielectrics and ultra low-k dielectrics. Further, the formation of the inherent barrier does not require introducing aggressive chemicals, such as fluorine containing chemicals, and does not require an accelerating/bias voltage exceeding 1500V. Typically, the required voltage does not exceed about 500V and preferably it does not exceed about 100V.

The process of fabricating an encapsulated ultra low-k dielectric SSC begins with the depositing of the pore-free low-k or medium-k SSC layer, where the SSC layer is typically in the thickness range from about 2 to about 10 nm. This depositing process is followed by the fabrication of the porous ultra low-k dielectric SSC by any of the above described embodiments. The top or cover barrier consisting of either a pore-free low-k or a medium-k SSC is then formed by any of the above described embodiments. If the porous SSC is being formed by alternating the deposition regime in a continuous vacuum process, the top or cover barrier is formed during the final step of the continuous vacuum process. If the porous SSC is being formed in a process outside the vacuum chamber, the top or cover barrier is formed following the final step of the atomic-scale or nano-scale porous dielectric formation.

A synergetic carbon network generally preserves its structural continuity up to a carbon content of about 25% and up to a combined content of carbon, silicon and oxygen of about 30% of the entire structure. The mechanical features of a diamond-like structure are preserved to some extent up to a combined porosity of about 70%.

For a rough estimate of k-value in a partially voided synergetic carbon structure, the following equation may be applied:

$$k^* = (k-1)(1-V)+1$$

In this equation, k* is a virtual k-value of a partially voided nano-structure dielectric, and k is the real k-value of the same dielectric. Correspondingly, an estimated minimum achievable k-value in the stabilized synergetic (diamond-like) carbon structure is approximately:

$$k^* \sim 0.3k+0.7$$

On the other hand, in one embodiment, there is a simple approximate ratio between the virtual values of the dielectric constant k* and the elastic modulus E* of a partially voided synergetic carbon material:

$$k^* \sim \{(k-1)(E^*/E)+1\}$$

where E is the real value of the elastic modules in the same dielectric. The last approximate ratio is justified up to an approximate relative pore volume of about V ~50%. At this point, k*~0.5k+0.5, and E~0.5 is, in principle, achievable. Therefore, a minimum k-value in a dense (pore-free) Stabilized Synergetic Carbon, possessing elastic modules of about 200 GPa or higher, is k=~4.0 and k*~2.5, along with the elastic modules approaching 100 GPa, is in principle achievable.

In a higher relative porosity range, this approximation may not be justified. However, mechanical properties of synergetic carbon are still superior with regard to other known lightweight materials. For instance, synergetic carbon possessing specific gravity of 1.35 g/cm sup3 shows a hardness of about 15 to about 18 GPa and elastic modules of over 100 GPa. Although this structure generally does not contain pores exceeding the atomic diameter, this density is about 40% of the dense crystalline carbon (diamond), i.e. the innate free volume of this structure is about 60%.

Additionally, the value of about k*~1.9 may still be realized even where elastic module values might be relatively high.

The invention claimed is:

1. A semiconductor device having a plurality of layers, including a low-k dielectric layer and medium-k dielectric layers, wherein the low-k dielectric layer is positioned between the medium-k dielectric layers, and the low-k dielectric layer and the medium-k dielectric layers comprise a stabilized synergetic carbon.

2. The device of claim 1 wherein the low-k dielectric layer has a dielectric constant not exceeding 3.0.

3. The device of claim 1 wherein the medium-k dielectric layers comprising stabilized synergetic carbon have a dielectric constant in the range from about 3 to about 5.9.

4. The device of claim 1 wherein the medium-k dielectric layers comprising stabilized synergetic carbon have a dielectric constant in the range of 4 to 5.

5. The device of claim 1 wherein the medium-k dielectric layers are resistant to water or vapor.

6. The device of claim 1 wherein the medium-k dielectric layers prevent atomic diffusion or ion electro-diffusion penetration into the semiconductor.

7. The device of claim 1 wherein the medium-k dielectric layers mechanically reinforce the low-k dielectric layer.

8. The device of claim 1 wherein said low-k dielectric layer comprises strain-controlling materials.

9. The device of claim 8 wherein the low-k dielectric layer has a dielectric constant not exceeding 3.0.

* * * * *